(12) United States Patent
Watanabe et al.

(10) Patent No.: US 10,396,745 B2
(45) Date of Patent: Aug. 27, 2019

(54) AUDIO PROCESSOR AND AUDIO PROCESSING METHOD

(71) Applicant: CLARION CO., LTD., Saitama-shi (JP)

(72) Inventors: Tetsuo Watanabe, Saitama (JP); Takeshi Hashimoto, Motomiya (JP)

(73) Assignee: CLARION CO., LTD., Saitama-Shi (JP)

( * ) Notice: Subject to any disclaimer, the term of this patent is extended or adjusted under 35 U.S.C. 154(b) by 0 days.

(21) Appl. No.: 16/091,513

(22) PCT Filed: Mar. 29, 2017

(86) PCT No.: PCT/JP2017/013072
§ 371 (c)(1),
(2) Date: Oct. 4, 2018

(87) PCT Pub. No.: WO2017/183405
PCT Pub. Date: Oct. 26, 2017

(65) Prior Publication Data
US 2019/0123704 A1    Apr. 25, 2019

(30) Foreign Application Priority Data
Apr. 19, 2016    (JP) .................................. 2016-083711

(51) Int. Cl.
*H03G 5/16*    (2006.01)
*H03G 9/02*    (2006.01)
(Continued)

(52) U.S. Cl.
CPC .......... *H03G 9/02* (2013.01); *H03H 17/0213* (2013.01); *H04R 3/04* (2013.01); *H03G 5/165* (2013.01)

(58) Field of Classification Search
None
See application file for complete search history.

(56) References Cited

U.S. PATENT DOCUMENTS 6,535,553 B1    3/2003 Limberg et al.
6,697,492 B1    2/2004 Yamaguchi et al.
(Continued)

FOREIGN PATENT DOCUMENTS

JP    2000-13158    1/2000
JP    2002-345075    11/2002
(Continued)

OTHER PUBLICATIONS

International Search Report for corresponding International Application No. PCT/JP2017/013072, dated Jun. 27, 2017.
(Continued)

*Primary Examiner* — Curtis A Kuntz
*Assistant Examiner* — Kenny H Truong
(74) *Attorney, Agent, or Firm* — Mori & Ward, LLP

(57) ABSTRACT

An audio processor (1) includes a first filter coefficient calculator (31) that calculates a first filter coefficient so as to correspond to first gains for respective bands set by a user, a second filter coefficient calculator (32) that if values of third gains for respective bands of the first filter coefficient are greater than an absolute value of a second gain set by the user, calculates a second filter coefficient by limiting the values of the third gains for the respective bands to the amplitude value of the second gain, and a filtering unit (35) that filters an audio signal that has been transformed into a frequency-domain signal, using the second filter coefficient.

6 Claims, 14 Drawing Sheets

(51) Int. Cl.
*H04R 3/04* (2006.01)
*H03H 17/02* (2006.01)

(56) References Cited

U.S. PATENT DOCUMENTS

| | | | | |
|---|---|---|---|---|
| 2005/0078840 A1* | 4/2005 | Riedl | ............... | H03G 7/007 |
| | | | | 381/104 |
| 2008/0187149 A1* | 8/2008 | Jung | ............... | H03G 5/165 |
| | | | | 381/72 |
| 2010/0226510 A1 | 9/2010 | Kikugawa | | |
| 2011/0081029 A1* | 4/2011 | Hashimoto | ........... | H03G 9/025 |
| | | | | 381/107 |
| 2011/0113081 A1 | 5/2011 | Teramoto et al. | | |
| 2014/0205111 A1 | 7/2014 | Hatanaka et al. | | |

FOREIGN PATENT DOCUMENTS

| | | |
|---|---|---|
| JP | 2010-212887 | 9/2010 |
| JP | 2013-65952 | 4/2013 |
| WO | WO 2010/041381 | 4/2010 |

OTHER PUBLICATIONS

Written Opinion for corresponding International Application No. PCT/JP2017/013072, dated Jun. 27, 2017.
Supplementary European Search Report for corresponding EP Application No. 17785747.1, dated Mar. 1, 2019.
Extended European Search Report for corresponding EP Application No. 17785747.1, dated Mar. 11, 2019.

\* cited by examiner

AUDIO PROCESSOR AND AUDIO PROCESSING METHOD

TECHNICAL FIELD

The present invention relates to an audio processor and audio processing method. More specifically, the present invention relates to an audio processor and audio processing method that when an audio signal exceeds an amplitude (signal level) range that can be processed (represented) by the audio processor, that is, when the audio signal exceeds a full-scale value and overflows, are able to increase the gains (signal levels) for respective bands while suppressing clipping.

BACKGROUND ART

Infinite impulse response (IIR) filters and finite impulse response (FIR) filters have been widely known as filters for use in audio processors.

An IIR filter is characterized in that it easily adjusts the gain (signal level) in any frequency band. However, an IIR filter requires a feedback loop process in computing. For this reason, computing using an IIR filter tends to accumulate computational errors. Accordingly, audio processing using an IIR filter disadvantageously shows low computational accuracy.

On the other hand, computing using an FIR filter consists of only one multiplication and one addition on each audio signal for each coefficient of the filter. For this reason, computing using an FIR filter does not accumulate computational errors and therefore shows high computational accuracy. However, in audio processing using an FIR filter, it is not easy to change only the gain in a particular frequency band. For this reason, computing using an FIR filter disadvantageously shows low frequency characteristics adjustability.

As methods to solve these problems, there have been proposed signal processors that have both the "adjustability" of an IIR filter and the "high accuracy with less computational errors" of an FIR filter (for example, see Patent Literature 1). Such a signal processor adjusts or sets a transfer function (frequency characteristics) using an IIR filter in "adjustment mode" in which any transfer function is adjusted. The signal processor then constructs a transfer function (filter coefficient) equivalent to the transfer function (filter coefficient) adjusted or set using the IIR filter, using an FIR filter in "signal processing mode" in which an adjusted or set audio signal is processed. Typically, a transfer function used in an IIR filter, FIR filter, or the like is called filter coefficient. A filter coefficient consists of a frequency range to which the filter coefficient is applied and gain values (gain coefficients) set to respective frequencies (frequency spectra).

Typically, when adjusting a transfer function with respect to an audio signal using an IIR filter, the IIR filter can be used as various types of filter. Examples of such filters include high-pass filters, which pass a high-frequency component signal, low-pass filters, which pass a low-frequency component signal, and peaking filters, which pass a particular band signal. To adjust the gain in any band using an IIR filter, a graphic equalizer including a peaking filter is typically used.

CITATION LIST

Patent Literature

PTL 1: WO 2010/041381

SUMMARY OF INVENTION

Technical Problem

A typical graphic equalizer includes a setting screen for displaying gains set for the respective bands. The gains set for the respective bands are shown by a bar graph on the setting screen. The user can change frequency characteristics of a low-frequency sound or high-frequency sound by adjusting or changing the gains for the respective bands while viewing the bar graph displayed on the setting screen.

A typical graphic equalizer has a volume setting function and other audio functions. Accordingly, by using the graphic equalizer, the user can adjust or change the gain in any frequency band, as well as can adjust or change the volume level. On the other hand, if the user increases the volume level to approximately the maximum value using the graphic equalizer with the gain in any band increased, the audio signal may exceed the full scale value and overflow and thus may be distorted or clipped.

As used herein, the term "full-scale value" refer to the upper limit of the signal level (amplitude) range that can be processed (represented) by an audio processor. For example, it is assumed that the amplitude range that can be processed (represented) is −2 to +2. If one audio signal has an amplitude of −2 or less or more than +2, this amplitude exceeds the full-scale value. Accordingly, when this audio signal is processed by the audio processor, the upper limit of the amplitude is limited to +2, or the lower limit thereof is limited to −2. Thus, the audio signal may be distorted.

As a method for preventing the signal level of the audio signal from exceeding the full-scale value when the volume level is set to a high value, the positive-side gain of the graphic equalizer may be limited (suppressed). However, if the gains in adjacent bands are increased, the adjacent gains influence (interfere with) each other. Thus, the gain values set for the respective bands may be exceeded, resulting in an increase in the entire gain (signal level) of the audio signal. Such an increase in the entire gain prevents the peak value of the final filter characteristics from being determined uniquely. This disadvantageously makes it difficult to properly determine the amount of gain to be limited.

The present invention has been made in view of the above problems, and an object thereof is to provide an audio processor and audio processing method that even if gains for respective bands are set to high values by a graphic equalizer, or even if the volume level is set to a high gain, are able to prevent clipping or distortion of an audio signal by effectively limiting the level (amplitude) of the audio signal that can be processed by the audio processor.

Solution to Problem

To solve the above problems, an audio processor according to one aspect of the present invention includes a Fourier transform unit configured to transform an audio signal from a time-domain signal into a frequency-domain signal, a filtering unit configured to perform a filtering process on the audio signal that has been transformed into the frequency-domain signal by the Fourier transform unit, using a second filter coefficient, an inverse Fourier transform unit configured to transform the audio signal subjected to the filtering process by the filtering unit, from the frequency-domain signal into a time-domain signal, a band gain setting unit configured to set first gains for respective bands used to perform the filtering process on the audio signal, a volume setting unit configured to set a second gain for increasing or reducing a volume of the audio signal, a first filter coefficient calculator configured to calculate a first filter coefficient that can increase or reduce gains for respective bands, so as to correspond to the first gains for the respective bands set by the band gain setting unit, and a second filter coefficient calculator configured to regard gains for respective bands of the first filter coefficient as third gains, to compare values of the third gains for the respective bands with an absolute value of the second gain set by the volume setting unit, and to, if the values of the third gains for the respective bands are greater than the absolute value of the second gain, calculate the second filter coefficient by limiting the values of the third gains for the respective bands to the absolute value of the second gain.

An audio processing method using an audio processor according to another aspect of the present invention includes a Fourier transform step of transforming, by a Fourier transform unit, an audio signal from a time-domain signal into a frequency-domain signal, a filtering step of performing, by a filtering unit, a filtering process on the audio signal that has been transformed into the frequency-domain signal, using a second filter coefficient, an inverse Fourier transform step of transforming, by an inverse Fourier transform unit, the audio signal subjected to the filtering process in the filtering step from the frequency-domain signal into a time-domain signal, a first filter coefficient calculation step of calculating, by a first filter coefficient calculator, a first filter coefficient that can increase or reduce gains for respective bands, so as to correspond to first gains for respective bands set by a user, and a second filter coefficient calculation step of regarding, by a second filter coefficient calculator, gains for respective bands of the first filter coefficient as third gains, comparing values of the third gains for the respective bands with an absolute value of a second gain set by the user to increase or reduce a volume of the audio signal, and if the values of the third gains for the respective bands are greater than the absolute value of the second gain, calculating the second filter coefficient by limiting the values of the third gains for the respective bands to the absolute value of the second gain.

If a sound (audio signal) has a large amplitude, a human feels that the volume of the sound is large. That is, the human determines the volume of the sound on the basis of the magnitude of the amplitude of the sound (audio signal). However, the volume of the sound varies among frequency bands. Accordingly, the human has difficulty in objectively determining the sound volumes for respective frequencies on the basis of only the magnitude of the amplitude. Here, an audio signal that the human hears with his or her ears is defined as a time-domain audio signal. By fast Fourier transforming the time-domain audio signal, it can be transformed into a frequency-domain signal, and the gains for respective frequencies of the audio signal can be obtained. Thus, the human can determine the volumes for respective bands of the sound on the basis of the gain values for respective frequencies.

Known methods for adjusting the volume of an audio signal (sound) on a frequency basis include filtering of a frequency-domain audio signal. A filter used in such a filtering process consists of allowable upper limit gain values (gain coefficients) for respective frequencies (frequency spectra). A coefficient representing frequency characteristics of such a filter is referred to as a filter coefficient. That is, the filter coefficient is a set of gain coefficients in which gain values serving as upper limits are set for the respective frequencies.

For convenience, the volume of an audio signal is referred to as "signal level." In the case of a time-domain audio signal, the magnitude of the "amplitude" corresponds to the magnitude of the "signal level"; in the case of a frequency-domain audio signal, the value of the "gain" corresponds to the magnitude of the "signal level."

A signal level (amplitude, gain) that can be processed (represented) by a typical audio processor is predetermined. Accordingly, if the level of an audio signal exceeds the signal level that can be processed (represented) by the audio processor, the level of the audio signal is compulsorily limited. Typical audio processors are provided with such a signal level limit function, and the ranges that can be processed by those audio processors are limited.

For this reason, if the user sets the volume to a relatively high volume (gain) on a typical audio processor and sets a high gain value for a particular band using an equalizer, the amplitude of an audio signal is more likely to exceed the allowable signal level. If the amplitude of the audio signal exceeds the allowable signal level, the amplitude of the audio signal is limited. Thus, the waveform of the signal may be deformed and clipped, resulting in distortion of the sound.

On the other hand, the above audio processor and audio processing method perform a filtering process on the audio signal that has been transformed into the frequency domain, using the second filter coefficient corresponding to the first gains for respective bands set by the user. In this process, first, a first filter coefficient that can increase or reduce gains for respective bands is calculated so as to correspond to the set first gains for respective bands. Then, the gains for respective bands of the first filter coefficient are regarded as third gains, and a comparison is made between the values of the third gains for the respective bands and the absolute value of the second gain set by the user to increase or reduce the volume of the audio signal. If the values of the third gains for the respective bands are greater than the absolute value of the second gain, the second filter coefficient is calculated by limiting the values of the third gains for the respective bands to the absolute value of the second gain.

By using the second filter coefficient obtained by limiting the values of the third gains for the respective bands to the second gain for volume setting, a filtering process is performed on the audio signal that has been transformed into the frequency domain. Due to this filtering process, the signal level (amplitude) of the audio signal that has been transformed into the time domain after the filtering process can be limited to the signal level (amplitude) that can be processed (represented) by the audio processor. Thus, the waveform of the filtered audio signal can be can prevented from being deformed, and clipping and distortion of the sound can be prevented.

Not the third gains of the first filter coefficient in all bands but only those in some bands greater than the absolute value of the second gain are limited to the absolute value of the second gain. Accordingly, the third gains are limited to the absolute value of the second gain in a restrictive manner, and the quality of the entire audio signal is not impaired.

A filtering process using the second filter coefficient obtained by limiting the gains is performed on the audio signal that has been transformed into the frequency domain, and the filtered audio signal is then transformed into the time domain. Thus, the amplitude of the audio signal that has been transformed into the time domain falls within the signal level (amplitude) range that can be represented (processed) by the audio processor. Also, the audio signal that has been transformed into the time domain can maintain a smooth waveform, and the waveform is less likely to be changed to a square shape or the like. Also, since clipping is suppressed, distortion of the sound can be prevented. Further, sound quality can be maintained or improved, and the audio processing effect obtained by the filtering process can be increased.

According to the above audio processor, when limiting the values of the third gains for the respective bands to the absolute value of the second gain, the second filter coefficient calculator may limit only the values of the third gains for predetermined frequency bands.

According to the above audio processing method, the second filter coefficient calculation step may comprise when limiting the values of the third gains for the respective bands to the absolute value of the second gain, limiting only the values of the third gains for predetermined frequency bands.

When limiting the values of the third gains for the respective bands of the first filter coefficient to the absolute value of the second gain, the above audio processor and audio processing method limit only the values of the third gains for predetermined frequency bands and thus can narrow the frequency range where the values of the third gains are limited. Thus, it is possible to reduce the computational load or the like associated with the process of calculating the second filter coefficient.

Typical music (audio signal) contains great energy in low frequency ranges. For this reason, increases in the gains (amplitudes) in low frequency ranges are more likely to cause clipping. If clipping occurs, harmonics occur in the audible band. Such harmonics are more likely to significantly affect the auditory sense. On the other hand, increases in the gains (amplitudes) in high frequency bands are less likely to give a great auditory impact.

For this reason, by limiting the third gain values in low frequency bands, it is possible to prevent clipping and distortion of the sound while suppressing a reduction in the auditory sound quality.

According to the above audio processor, when limiting the values of the third gains for the respective bands to the absolute value of the second gain, the second filter coefficient calculator may change the values of the third gains by weighting values of the third gains, in accordance with frequencies.

According to the above audio processing method, the second filter coefficient calculation step may comprise when limiting the values of the third gains for the respective bands to the absolute value of the second gain, changing the values of the third gains by weighting values of the third gains, in accordance with frequencies.

When limiting the values of the third gains for the respective bands of the first filter coefficient to the absolute value of the second gain, the above audio processor and audio processing method weight the values of the third gains in accordance with frequencies. Due to this weighting, the values of the third gains to be limited can be changed, and the values of the third gains to be limited can be reduced in accordance with the bands. Thus, compared to when predetermined gains are limited uniformly, it is possible to reduce the computational load or the like associated with the process of calculating the second filter coefficient.

Increases in the gains (amplitudes) in low frequency bands are more likely to cause clipping. If clipping occurs, harmonics occur in the audible band. Such harmonics are more likely to significantly affect the auditory sense. On the other hand, increases in the gains (amplitudes) in high frequency bands are less likely to give a great auditory impact.

For this reason, the values of the third gains to be limited are changed by weighting the values of the third gains to be limited such that the values of the third gains are reduced as the frequency band is shifted from a low frequency band to a high frequency band. Thus, the gains in low frequency bands can be effectively limited to reduce clipping, and distortion of the sound can be suppressed. Also, by limiting the gains in high frequency bands to a lesser extent than those in low frequency bands, it is possible to suppress the limit of the gains in high frequency bands, which are less likely to give a great auditory impact.

Advantageous Effects of Invention

The audio processor and audio processing method according to an embodiment of the present invention perform a filtering process on the audio signal that has been transformed into the frequency domain, using the second filter coefficient corresponding to the first gains for respective bands set by the user. In this process, first, a first filter coefficient that can increase or reduce gains for respective bands is calculated so as to correspond to the set first gains for respective bands. Then, the gains for respective bands of the first filter coefficient are regarded as third gains, and a comparison is made between the values of the third gains for the respective bands and the absolute value of the second gain set by the user to increase or reduce the volume of the audio signal. If the values of the third gains for the respective bands are greater than the absolute value of the second gain, the second filter coefficient is calculated by limiting the values of the third gains for the respective bands to the absolute value of the second gain.

By using the second filter coefficient obtained by limiting the values of the third gains for the respective bands to the second gain for volume setting, a filtering process is performed on the audio signal that has been transformed into the frequency domain. Due to this filtering process, the signal level (amplitude) of the audio signal that has been transformed into the time domain after the filtering process can be limited to the signal level (amplitude) that can be processed (represented) by the audio processor. Thus, the waveform of the filtered audio signal can be can prevented from being deformed, and clipping and distortion of the sound can be prevented.

Not the third gains of the first filter coefficient in all bands but only those in some bands greater than the absolute value of the second gain are limited to the absolute value of the second gain. Accordingly, the third gains are limited to the absolute value of the second gain in a restrictive manner, and the quality of the entire audio signal is not impaired.

A filtering process using the second filter coefficient obtained by limiting the gains is performed on the audio signal that has been transformed into the frequency domain, and the filtered audio signal is then transformed into the time domain. Thus, the amplitude of the audio signal that has been transformed into the time domain falls within the signal level (amplitude) range that can be represented (processed) by the audio processor. Also, the audio signal that has been transformed into the time domain can maintain a smooth waveform, and the waveform is less likely to be changed to a square shape or the like. Also, since clipping is suppressed, distortion of the sound can be prevented. Further, sound quality can be maintained or improved, and the audio processing effect obtained by the filtering process can be increased.

DESCRIPTION OF EMBODIMENTS

Figure 1:
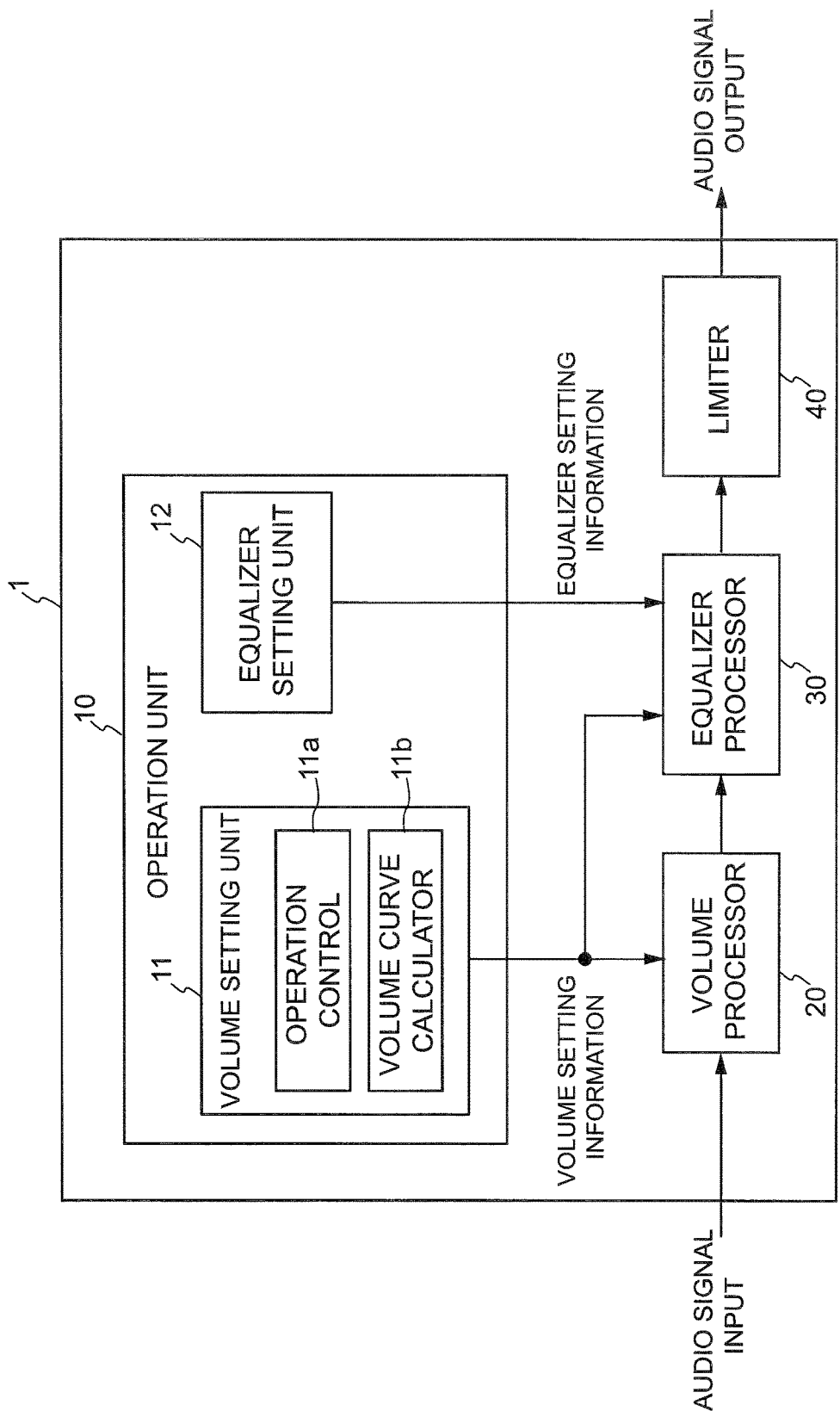
FIG. 1 is a block diagram showing a schematic configuration of an audio processor according to an embodiment.

Now, an audio processor according to one embodiment of the present invention will be described in detail using an audio processor having a schematic configuration shown in FIG. 1. As shown in FIG. 1, an audio processor 1 includes an operation unit 10, a volume processor 20, an equalizer processor 30, and a limiter 40. An audio signal inputted to the audio processor 1 is processed by the volume processor 20 and equalizer processor 30 and then the level of the audio signal is limited by the limiter 40. The audio signal outputted from the limiter 40 is amplified by an amplifier (not shown) and then outputted from a speaker (not shown).

[Operation Unit]

The operation unit 10 includes a volume setting unit 11 that the user operates to adjust (set) the volume and an equalizer setting unit (band gain setting unit) 12 that the user operates to adjust the gains for respective bands.

[Volume Setting Unit]

The volume setting unit 11 includes a rotatable operation control (rotational operation unit) 11a disposed on the case or the like of the audio processor 1 and a volume curve calculator 11b that determines the gain (second gain) on the basis of the amount of rotation of the operation control 11a. By rotating the operation control 11a, the user can change/adjust the volume step by the volume setting unit 11 to, for example, any of 0 to 40 consisting of 41 steps.

Figure 2:
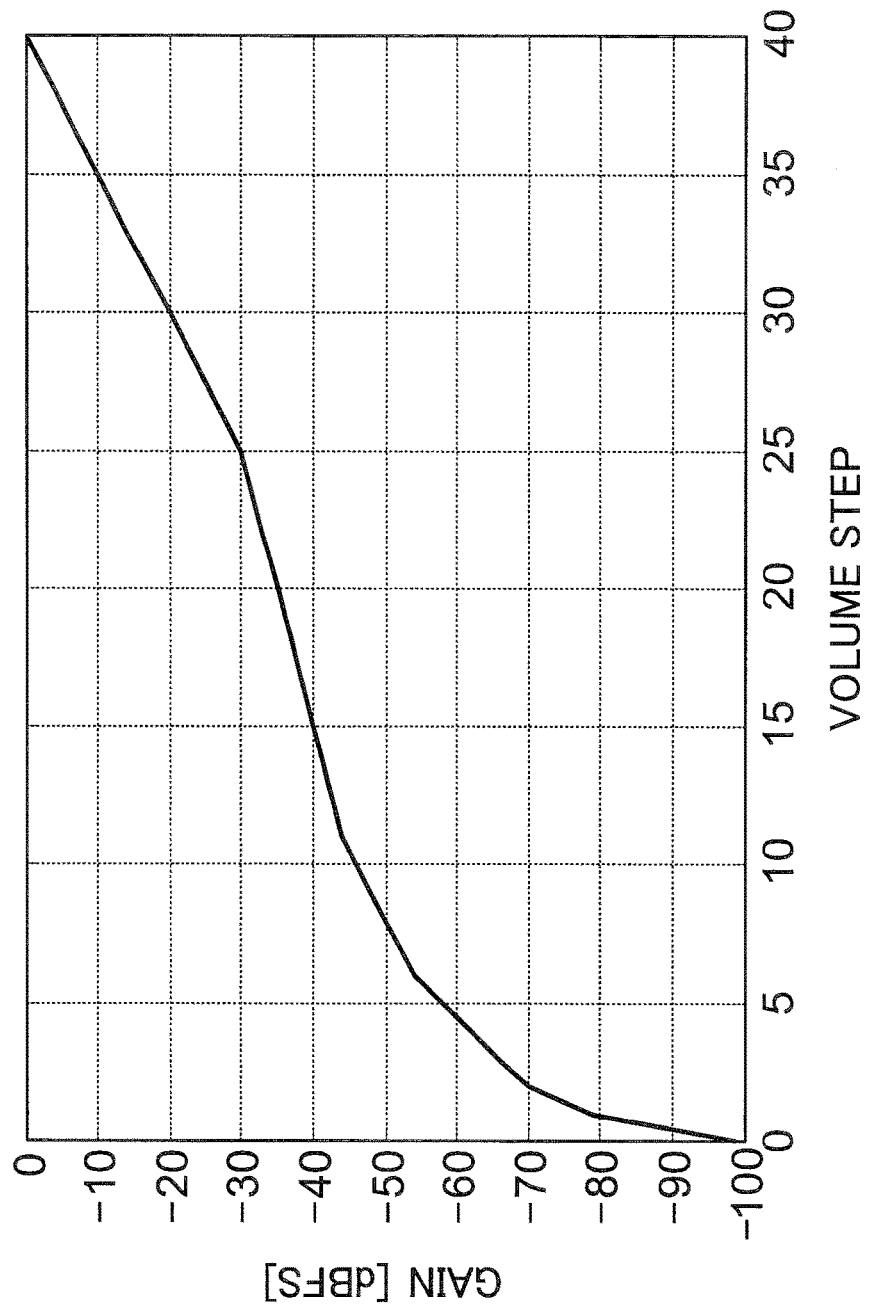
FIG. 2 is a graph showing the correspondences between the volume steps and gains obtained by a volume curve calculator according to the embodiment.

The volume curve calculator 11b determines the gain (dBFS) (second gain) corresponding to the amount of rotation (volume step) of the operation control 11a on the basis of a volume curve graph shown in FIG. 2. For example, if the volume step is 0, the volume curve calculator 11b determines the gain as −100 dBFS; if the volume step is 40, it determines the gain as 0 dBFS. The volume curve calculator 11b outputs the determined gain (dBFS) (second gain) as volume setting information to the volume processor 20 and equalizer processor 30.

[Equalizer Setting Unit]

Figure 3:
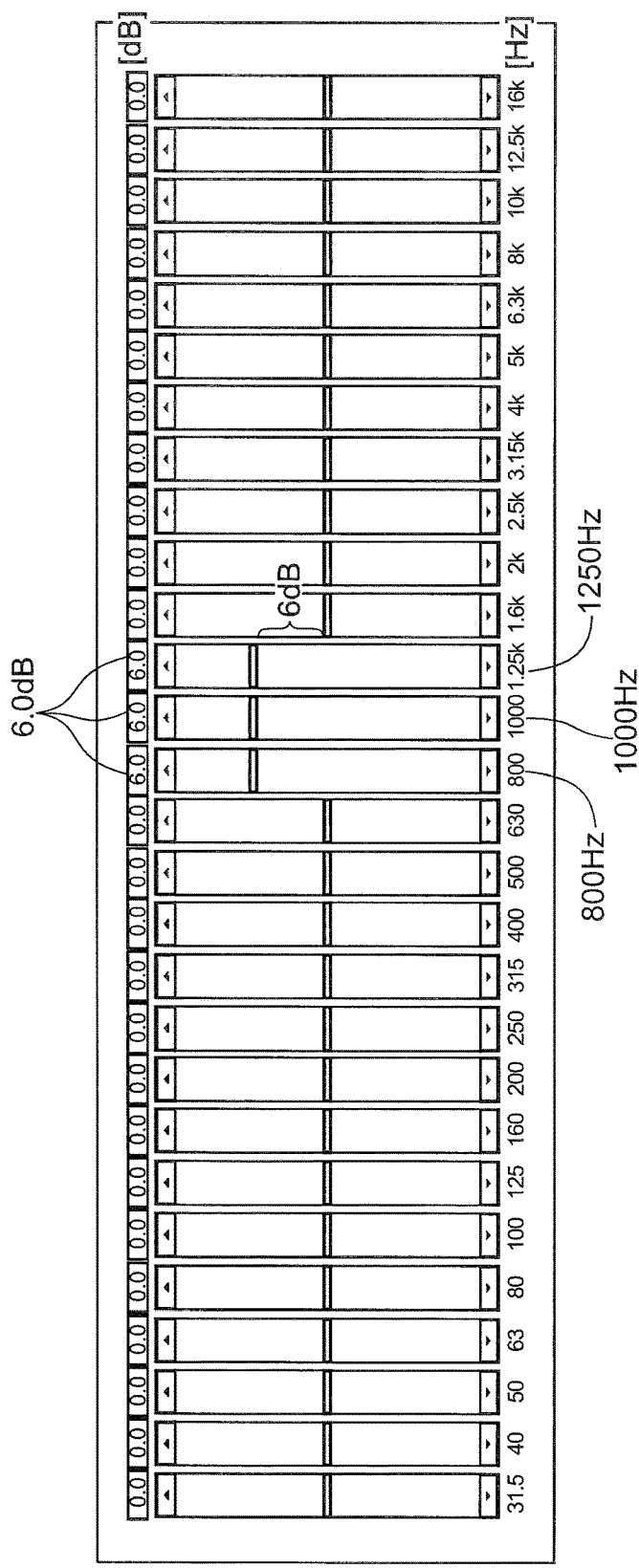
FIG. 3 is a drawing showing the equalizer setting screen of an equalizer setting unit according to the embodiment.

The equalizer setting unit 12 includes an equalizer setting screen as shown in FIG. 3. The user can change or set the frequency band and gain on the equalizer setting screen, for example, by touching it. Multiple (28 in FIG. 3) vertically-oriented square images representing divided bands are horizontally arranged on the equalizer setting screen. The center frequencies (31.5 Hz to 16 kHz in FIG. 3) of the divided bands are shown under the vertically-oriented square images. Also, horizontal, rod-shaped markings representing the gains are shown on the vertically-oriented square images. By vertically moving the rod-shaped markings, the gains (dB) (first gains) can be set or changed (within −10 dB to +10 dB in the case of FIG. 3). The gains (dB) set for the respective bands are shown over the vertically-oriented square images.

The user can select any band by touching the corresponding vertically-oriented square image and can change the gain (first gain) of the selected band by vertically moving the rod-shaped marking thereof. The user also can change the gain (first gain) by touching arrows shown on upper and lower portions of the vertically-oriented square image.

The equalizer setting unit 12 outputs the band information and gain information set by the user to the equalizer processor 30 as equalizer setting information.

[Volume Processor]

Figure 4A:
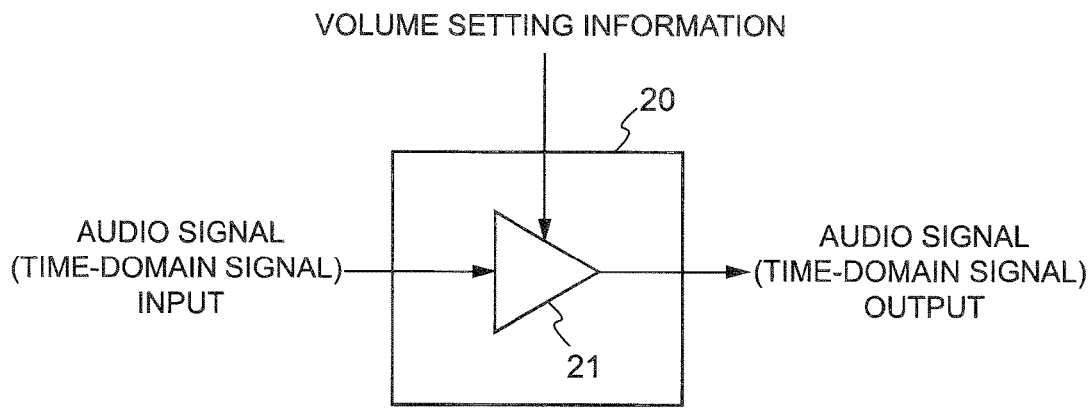
FIG. 4(a) is a block diagram showing a schematic configuration of a volume processor according to the embodiment.

The volume processor 20 adjusts the level of the inputted audio signal on the basis of the volume setting information received from the volume setting unit 11. Specifically, the volume processor 20 includes a gain unit 21 as shown in FIG. 4(a). The gain unit 21 attenuates the level of the inputted audio signal on the basis of the volume setting information. For example, if the volume setting information is −6 dB, it adjusts the signal level to about 0.5 times (−6 dB≈0.5 times) thereof. The audio signal, whose level has been adjusted by the volume processor 20 on the basis of the volume setting information, is outputted to the equalizer processor 30.

[Limiter]

The limiter 40 limits the level of the processed audio signal to the signal level that can be represented by the audio processor 1. A signal level (amplitude) that can be represented (processed) by a typical audio processor is predetermined. If the level (amplitude) of an audio signal exceeds the signal level that can be represented by processed by the audio processor, the signal level (amplitude) is compulsorily limited. Many audio processors are provided with such a signal level limit function. The limiter 40 of the audio processor 1 according to the present embodiment has this function. A typical audio processor is provided with a signal level limit function corresponding to the function of the limiter 40. The signal level (amplitude) range that can be represented by the audio processor is limited by this limit function.

As described above, there is a limit to the signal level (amplitude) that can be represented by a typical audio processor. Accordingly, if the level of an audio signal is increased by a processor of that audio processor corresponding to the equalizer processor 30 or volume processor 20, the signal level is compulsorily limited (suppressed) by the limit function of a limiter thereof. Thus, the audio signal may be clipped, and the sound may be distorted.

In the case of the audio processor 1 according to the present embodiment, an amplitude range of −1 to +1, for example, is set as the signal level (amplitude) range that can be represented thereby. Accordingly, when an audio signal having an amplitude exceeding a range of −1 to +1 is processed by the audio processor 1, the audio signal whose upper amplitude limit has been compulsorily limited to +1 and whose lower amplitude limit has been compulsorily limited to −1 is outputted from the limiter 40.

[Equalizer Processor]

The equalizer processor 30 has a function of changing or adjusting the gain corresponding to the band set using the equalizer setting unit 12, of the audio signal whose level (gain) has been changed or adjusted by the volume processor 20.

Figure 5:
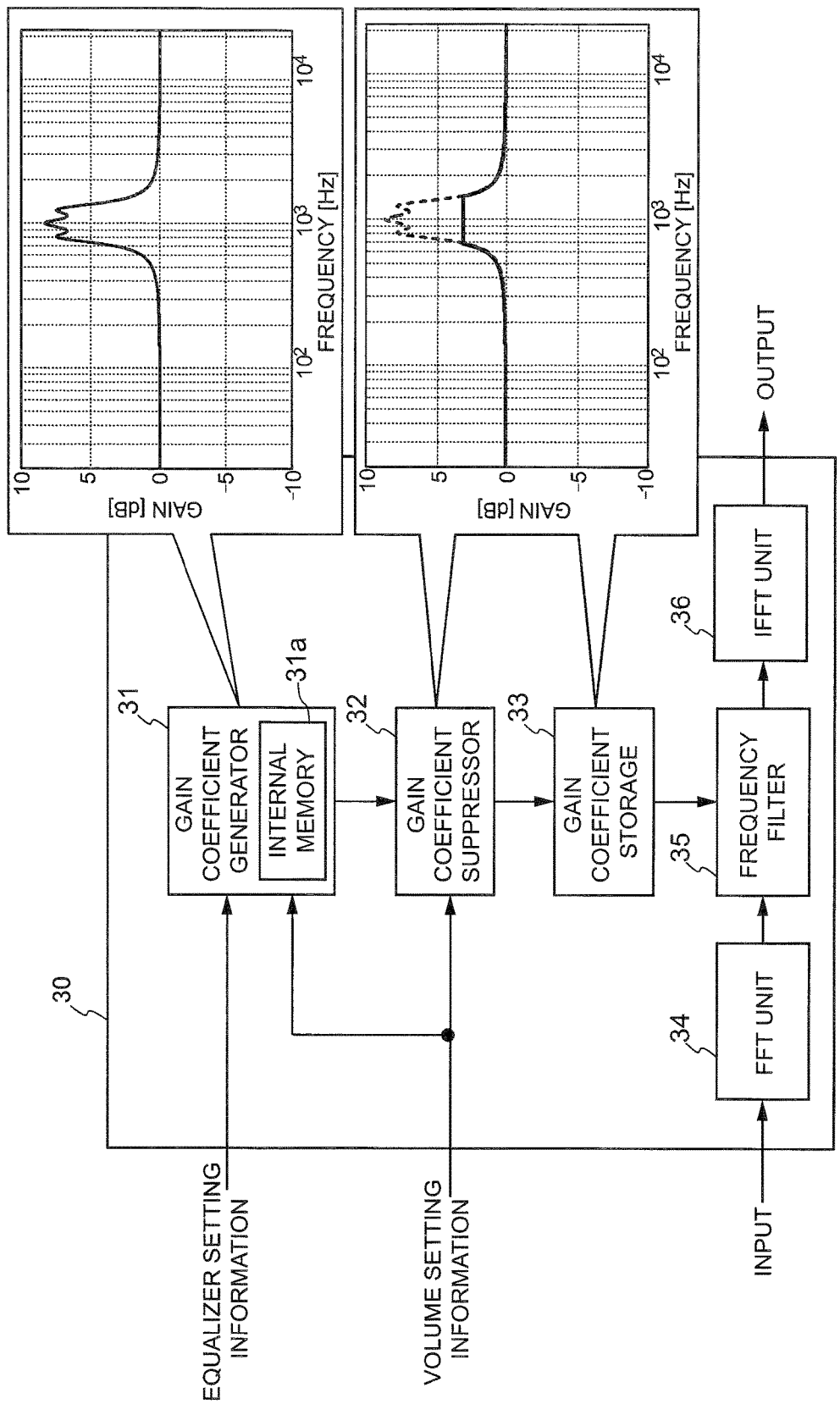
FIG. 5 is a block diagram showing a schematic configuration of an equalizer processor according to the embodiment.

As shown in FIG. 5, the equalizer processor 30 includes a gain coefficient generator (first filter coefficient calculator) 31, a gain coefficient suppressor (second filter coefficient calculator) 32, a gain coefficient storage 33, an FFT (fast Fourier transform) unit (Fourier transform unit) 34, a frequency filter (filtering unit) 35, and an IFFT (inverse fast Fourier transform) unit (inverse Fourier transform unit) 36.

Figure 6:
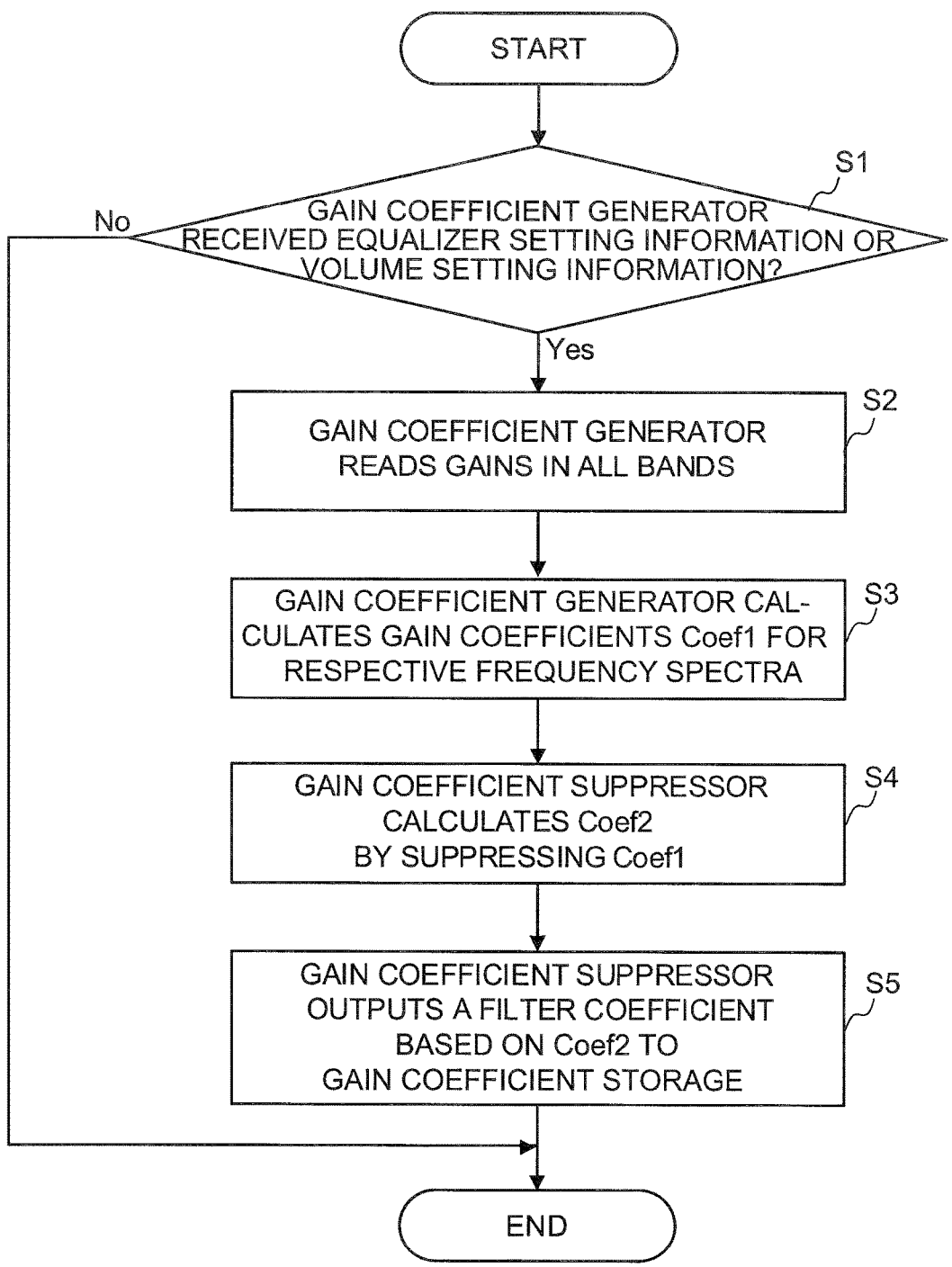
FIG. 6 is a flowchart showing a process performed by a gain coefficient generator and a gain coefficient suppressor according to the embodiment.

When the gain coefficient generator 31 obtains the volume setting information from the volume setting unit 11 or obtains the equalizer setting information from the equalizer setting unit 12, it calculates a yet-to-be-limited filter coefficient (first filter coefficient: a set of gain coefficients (third gains) for respective band spectra) (to be discussed later). Also, when the gain coefficient suppressor 32 obtains the volume setting information from the volume setting unit 11, it calculates a limited filter coefficient (second filter coefficient: a set of gain coefficients for respective band spectra) (to be discussed later). FIG. 6 is a flowchart showing a process performed by the gain coefficient generator 31 and gain coefficient suppressor 32.

The FFT unit 34 always short-time Fourier transforms (fast Fourier transforms) a received audio signal. The frequency filter 35 always filters a received audio signal using an FIR filter. The IFFT unit 36 always short-time inverse Fourier transforms (fast inverse Fourier transforms) a received audio signal.

[FFT Unit]

The FFT unit 34 transforms the audio signal inputted to the equalizer processor 30 from a time-domain signal into a frequency-domain signal (Fourier transform step). More specifically, the FFT unit 34 overlaps the received audio signal, weights the resulting signal using a window function, and then short-time Fourier transforms the resulting signal. Through these processes, the FFT unit 34 transforms the audio signal from the time domain into the frequency domain, that is, generates a frequency spectrum signal consisting of real and imaginary numbers.

The FFT unit 34 according to the present embodiment performs these processes under the following conditions: the sampling frequency is 96 kHz; the Fourier transform length is 16,384 samples; the overlap length is 12,288 samples; and the window function is a Hanning window. The FFT unit 34 short-time Fourier transforms the audio signal while shifting the time on a 4,096-sample basis and thus can obtain a 16,384-point frequency spectrum signal. The FFT unit 34 according to the present embodiment generates a frequency spectrum signal of 8,193 points corresponding to a Nyquist frequency of 0 Hz to 48 kHz, of 16,384 points. The FFT unit 34 then outputs the generated frequency spectrum signal to the frequency filter 35.

[Gain Coefficient Generator]

When the gain coefficient generator 31 receives the equalizer setting information from the equalizer setting unit 12 or when it receives the volume setting information from the volume setting unit 11, it calculates a yet-to-be-limited filter coefficient (first filter coefficient) for an FIR filter. The gain coefficient generator 31 includes an internal memory 31a.

The gain coefficient generator 31 determines whether it has received the equalizer setting information from the equalizer setting unit 12 or has received the volume setting information from the volume setting unit 11 (step S1 in FIG. 6). If it has not received the equalizer setting information or volume setting information (No in step S1 of FIG. 6), the gain coefficient generator 31 ends the filter coefficient calculation process.

On the other hand, if it has received the equalizer setting information or volume setting information (Yes in step S1 of FIG. 6), the gain coefficient generator 31 reads the latest gains (first gains) in all the bands from the internal memory 31a (step S2 in FIG. 6).

The internal memory 31a can store the gains for respective bands (first gains) set or changed by the user and to be read on the basis of the equalizer setting information such that the gains stored are associated with the respective bands. Note that equalizer setting information is generated when the user sets or changes the gain in any band using the equalizer setting unit 12 and then outputted from the equalizer setting unit 12 to the gain coefficient generator 31. Accordingly, the gain coefficient generator 31 does not receive new equalizer setting information unless the user changes the gain in any band.

If the gain coefficient generator 31 receives the equalizer setting information, it changes (updates) the gains for respective bands stored in the internal memory 31a on the basis of band information and gain information (first gains) in the received equalizer setting information. Due to these changes, the changed gains in all the bands are stored in the internal memory 31a.

For this reason, if it receives the equalizer setting information or volume setting information (Yes in step S1 of FIG. 6), the gain coefficient generator 31 can obtain the latest gain information changed by the user using the equalizer setting unit 12 by reading the latest gain information in the respective bands from the internal memory 31a.

Also, the internal memory 31a of the gain coefficient generator 31 is storing gain coefficients having the same amplitude characteristics as a peaking second-order IIR filter, where the center frequencies of the respective bands form peaks, such that the gain coefficients are associated with the respective bands. A peaking second-order IIR filter is typically used as a parametric equalizer (PEQ).

The gain coefficient generator 31 reads the latest gains for the respective bands from the internal memory 31a (step S2 in FIG. 6) and calculates a filter coefficient (first filter coefficient) for an FIR filter on the basis of the read gain information in respective bands and amplitude characteristics of the peaking second-order IIR filter (step S3 in FIG. 6: first filter coefficient calculation step). Here, the gain coefficients (third gains) for respective frequency spectra in the first filter coefficient are defined as Coef1. Accordingly, the first filter coefficient is obtained by calculating the gain coefficients for respective frequency spectra Coef1.

More specifically, the first filter coefficient for an FIR filter (yet-to-be-limited filter coefficient) is calculated by adding peaking filters for respective bands corresponding to the gains for the respective bands read from the internal memory 31a. For example, consider a case in which a gain of +6 dB is set for peaking filters of adjacent three bands whose cutoff frequencies are 800 Hz, 1000 Hz, and 1250 Hz, as shown in the setting screen of the equalizer setting unit 12 in FIG. 3. These settings are shown by dotted lines in FIG. 7. The gain coefficient generator 31 calculates filter frequency characteristics (filter coefficient) shown by a solid line in FIG. 7 by adding the three peaking filters shown by the dotted lines in FIG. 7. The Q factors (shape factors) of the peaking filters of these bands are 6, which is common to these bands. The Q factors are calculated by fc/BW where fc (Hz) represents the center frequency of each band; and BW (Hz) represents the bandwidth.

Figure 7:
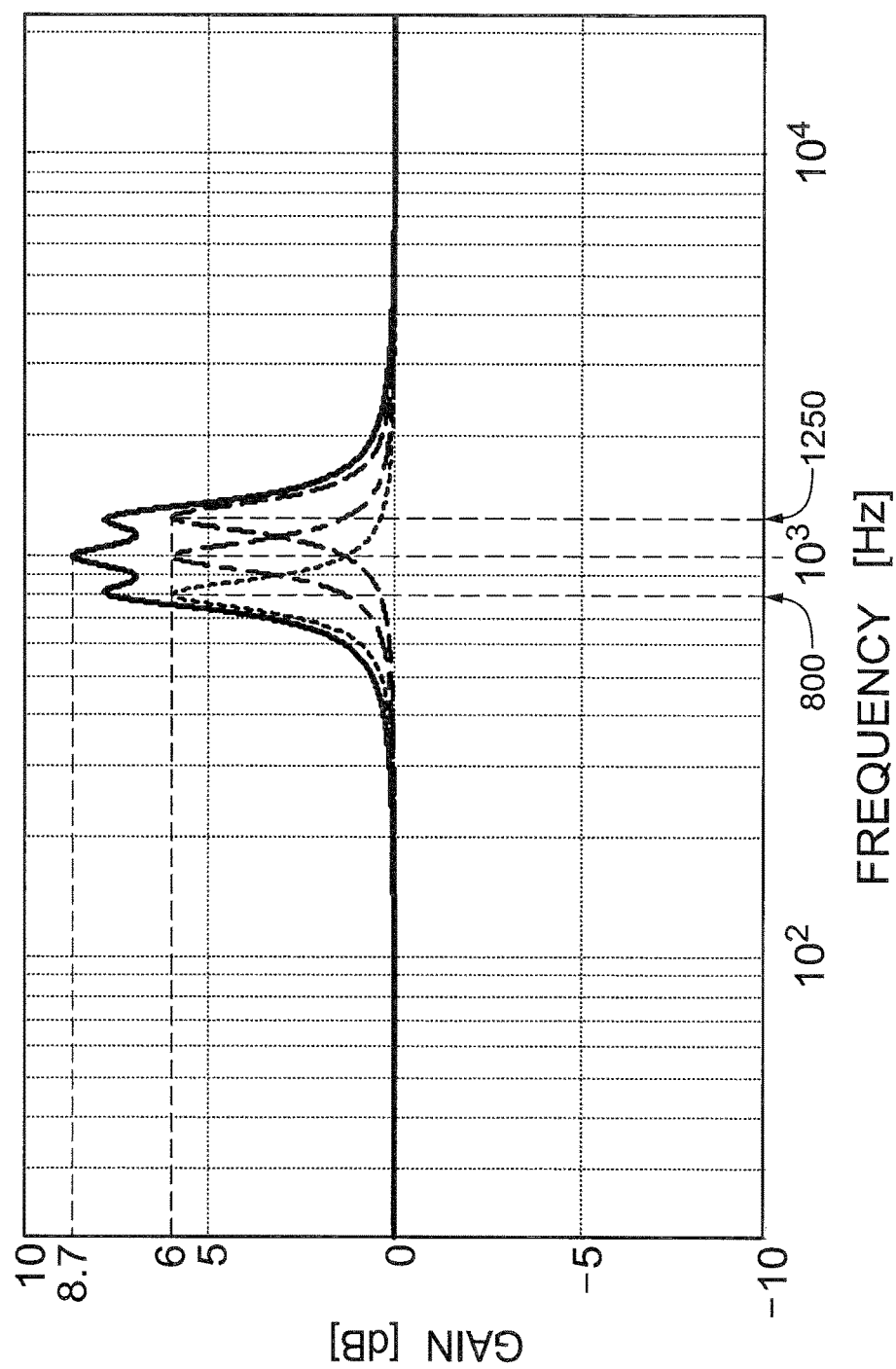
FIG. 7 is a diagram showing a filter coefficient (filter frequency characteristics) when the gains at adjacent 800 Hz, 1000 Hz, and 1250 Hz are set to +6 dB using the equalizer setting unit according to the embodiment.

As shown in FIG. 7, the peaks of the peaking filters of 800 Hz, 1000 Hz, and 1250 Hz are +6 dB. However, 800 Hz, 1000 Hz, and 1250 Hz are adjacent to each other and therefore the filter characteristics of the peaking filters influence each other. For this reason, the entire filter characteristics are a combination of the filter characteristics (band characteristics) for the respective bands. As shown in FIG. 7, in the entire filter frequency characteristics, the gain (peak) value at 1000 Hz, which is the center, is about 8.7 dB.

The gain coefficient generator 31 outputs the calculated filter coefficient (first filter coefficient) to the gain coefficient suppressor 32.

[Gain Coefficient Suppressor]

The gain coefficient suppressor 32 limits (suppresses) the gain values (third gains) of the filter coefficient (first filter coefficient) on the basis of the gain (second gain) received as the volume setting information and the filter coefficient received from the gain coefficient generator 31 (first filter coefficient) (step S4 in FIG. 6: second filter coefficient calculation step). That is, the gain coefficient suppressor 32 limits the gain coefficients for respective frequency spectra Coef1 (third gain) in the first filter coefficient using the gain (second gain) received as the volume setting information.

Specifically, the gain coefficient suppressor 32 calculates limited gain coefficients Coef2 (dB) by Formula 1 below using the gain coefficients (third gains) for respective frequency spectra Coef1 (dB) calculated by the gain coefficient generator 31.

$$Coef2 = \min(Coef1, |vol|) \qquad \text{Formula 1}$$

where vol represents the gain (second gain; in dBFS) received as the volume setting information.

The processing of Formula 1 is applied to 8,193 points corresponding to each frequency.

If the gain coefficients (third gains) for respective frequency spectra Coef1 (dB) calculated by the gain coefficient generator 31 are greater than the absolute value of the gain vol (dBFS) (the absolute value of the second gain) received as the volume setting information, the gain coefficient suppressor 32 limits the values of the gain coefficients Coef1 to the absolute value of the gain vol (dBFS) serving as the upper limit on the basis of Formula 1 (saturation operation process, suppression process). Thus, the gain coefficient suppressor 32 generates (calculates) Coef2, whose gain coefficient values are limited.

That is, if the values of the gain coefficients Coef1 (dB) for respective frequencies (corresponding point numbers) set by the user using the equalizer setting unit 12 are greater than the absolute value of the gain vol (dBFS) set by the user using the volume setting unit 11, Coef2 is calculated by limiting the gain coefficients Coef1 (dB).

For example, it is assumed that the gain vol (dBFS) set by the user using the volume setting unit 11 is −3 dBFS. If the values of the gain coefficients Coef1 (dB) set using the equalizer setting unit 12 exceed +3 dB, the gain coefficient suppressor 32 calculates Coef2 by limiting those values to +3 dB.

Figure 8:
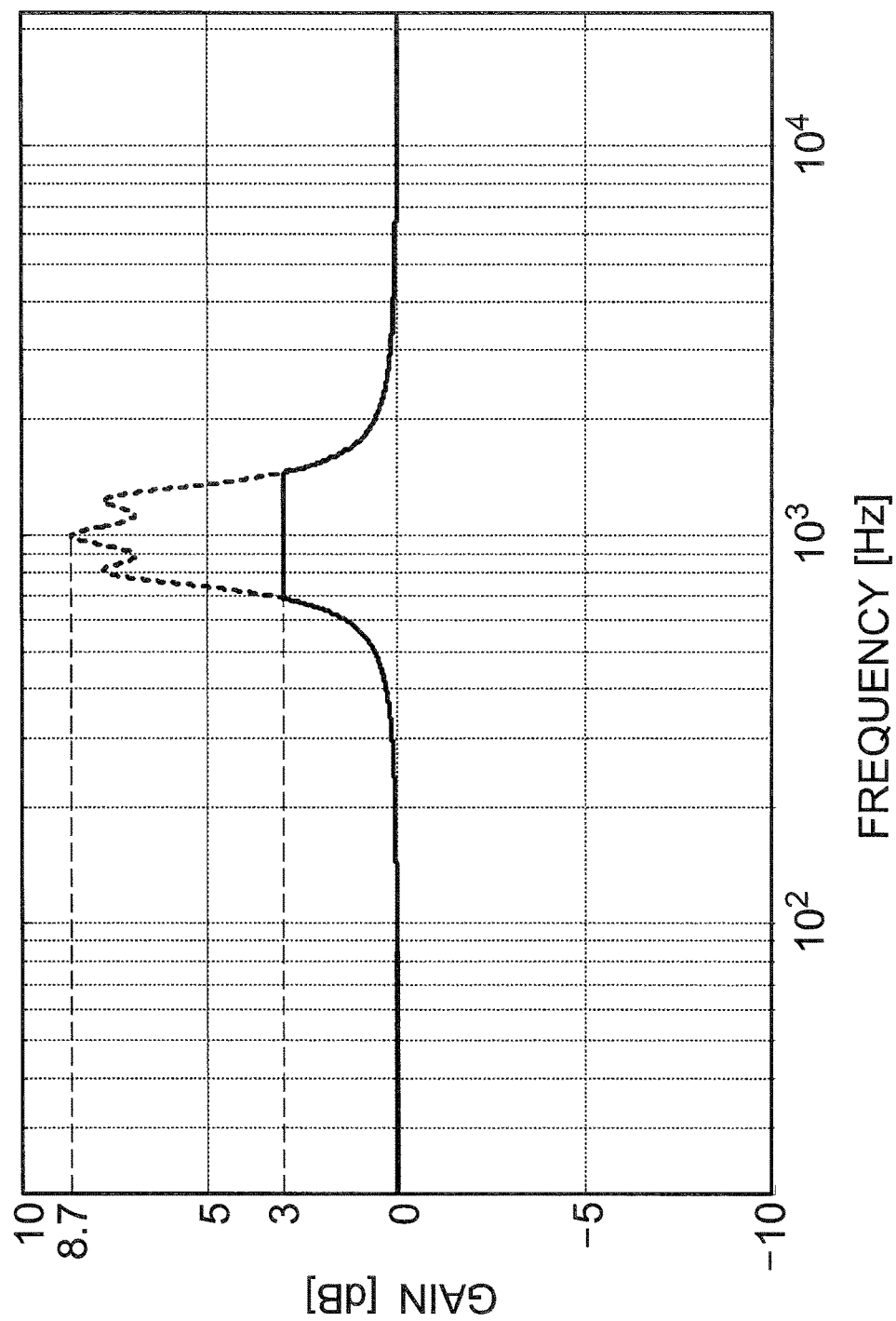
FIG. 8 is a diagram showing a filter coefficient obtained by limiting the gain values of the filter coefficient shown in FIG. 7 to +3 dB.

FIG. 8 shows a filter coefficient (frequency characteristics) obtained by limiting the gain values of the filter coefficient shown in FIG. 7 to +3 dB. In FIG. 8, the change state of the filter coefficient that has yet to be limited to +3 dB is shown by a broken line, and the change state of the filter coefficient limited to +3 dB is shown by a solid line. In the filter coefficient shown by the solid line, as shown in FIG. 8, +3 dB serves as the upper limit of the gains. The gain coefficient suppressor 32 finally obtains coefficients by transforming logarithms into linear values on the basis of Coef2 (dB) calculated on the basis of Formula 1 and outputs a filter coefficient (second filter coefficient) based on the obtained coefficients to the gain coefficient storage 33 (step S5 in FIG. 6). For example, the gain coefficient suppressor 32 obtains a filter coefficient by transforming the upper limit gain values of +3 dB of the filter coefficient shown by the solid line in FIG. 8 into values of about 1.4125 (corresponding to the amplitude; 3 dB≈1.4125) which have been transformed into linear values and then outputs the obtained filter coefficient to the gain coefficient storage 33.

Figure 9:
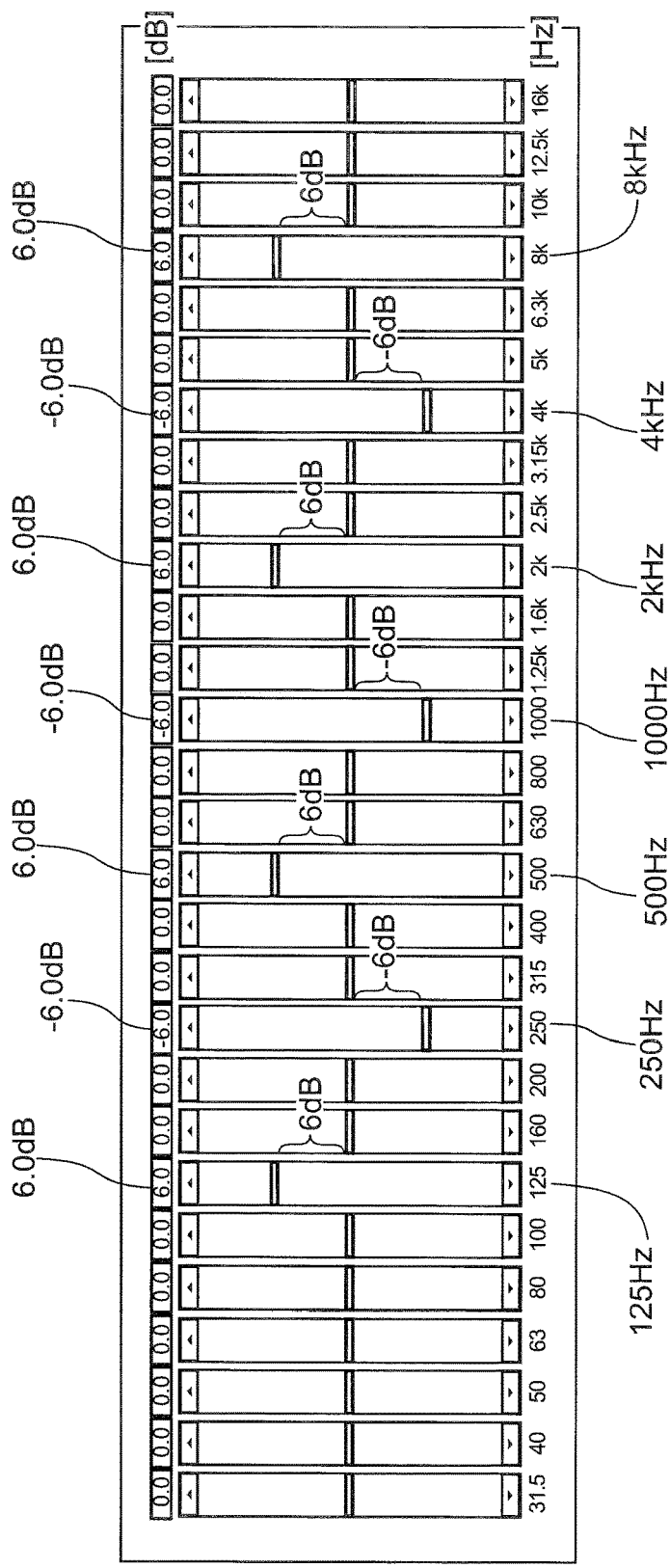
FIG. 9 is another drawing showing the equalizer setting screen of the equalizer setting unit according to the embodiment.
Figure 10A:
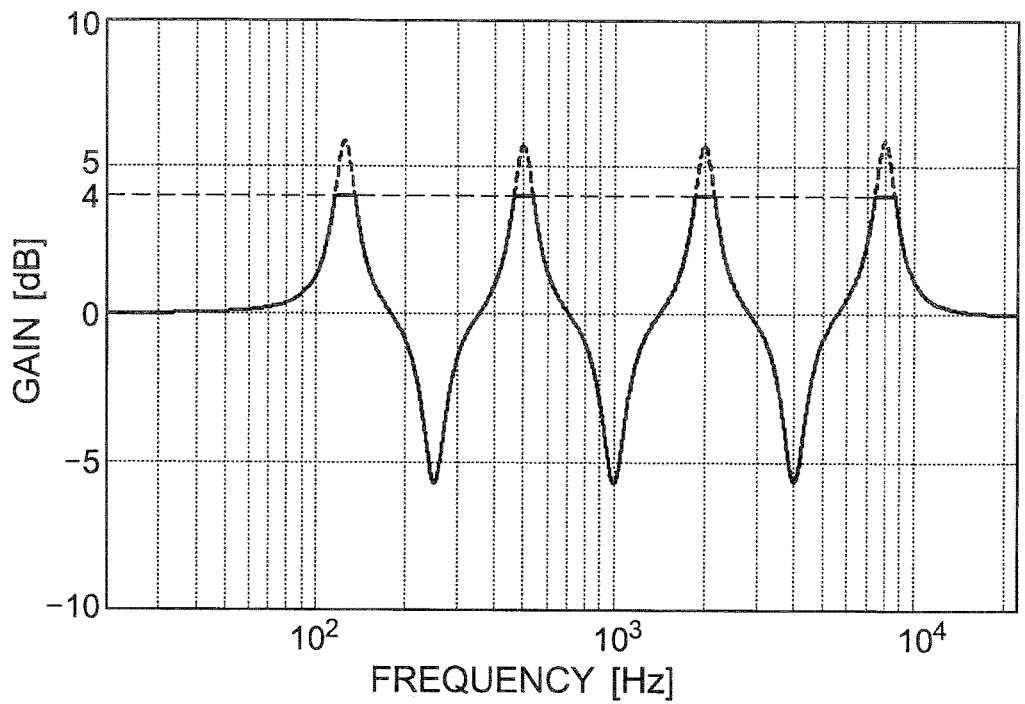
FIGS. 10(a) and 10(b) are diagrams showing a filter coefficient obtained by setting the gains for respective bands as shown in the equalizer setting screen in FIG. 9.
Figure 10B:
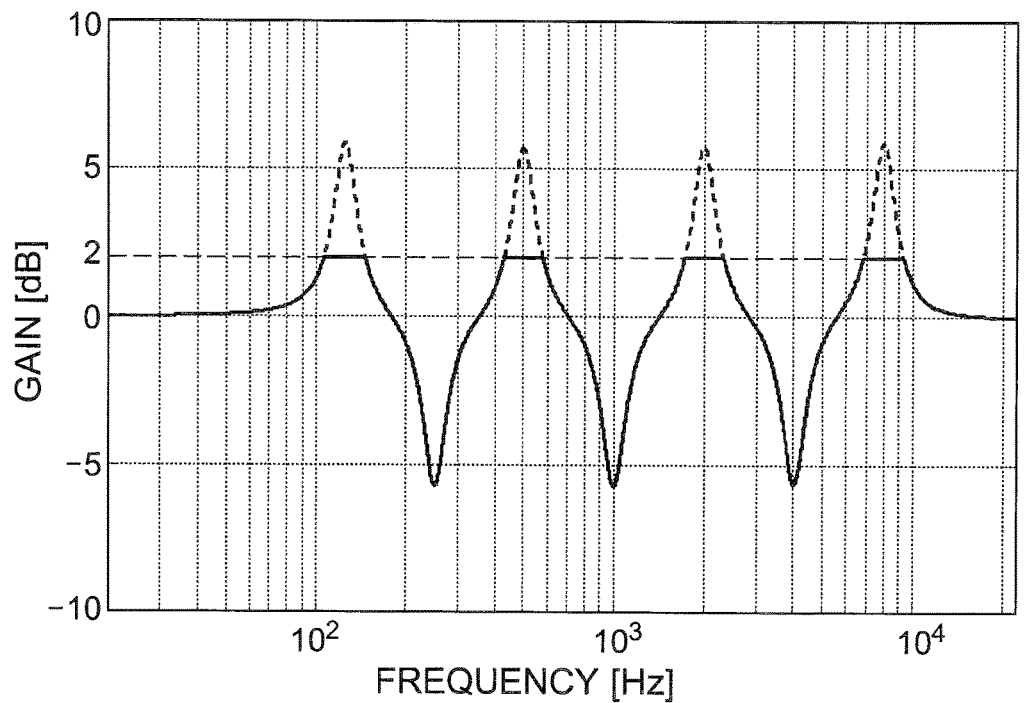

As other examples, FIGS. 10(a) and 10(b) show frequency characteristics when the user sets gains on the equalizer setting screen as shown in FIG. 9. FIG. 10(a) shows a case in which the gain vol (dBFS) set by the user using the volume setting unit 11 is −4 dBFS and in which the values of the gain coefficients Coef1 (dB) set using the equalizer setting unit 12 are limited to +4 dB by the gain coefficient suppressor 32 (Coef2=+4 dB).

FIG. 10(b) shows a case in which the gain vol (dBFS) set by the user using the volume setting unit 11 is −2 dBFS and in which the values of the gain coefficients Coef1 (dB) set using the equalizer setting unit 12 are limited to +2 dB by the gain coefficient suppressor 32 (Coef2=+2 dB). Note that as shown in FIGS. 10(a) and 10(b), the negative values of the gain coefficients (Coef2) are not affected by the gain vol (dBFS) set by the user and therefore the values of the gain coefficients are not changed.

FIGS. 8, 10(a), and 10(b) show cases in which the gain values of the filter coefficient are uniformly limited to the same value, regardless of the band, that is, without depending on the frequency value. On the other hand, as shown in FIGS. 11(a), 11(b), 12(a), and 12(b), the upper limits of the gain coefficients may be changed in accordance with the frequency, or may be weighted.

Figure 11A:
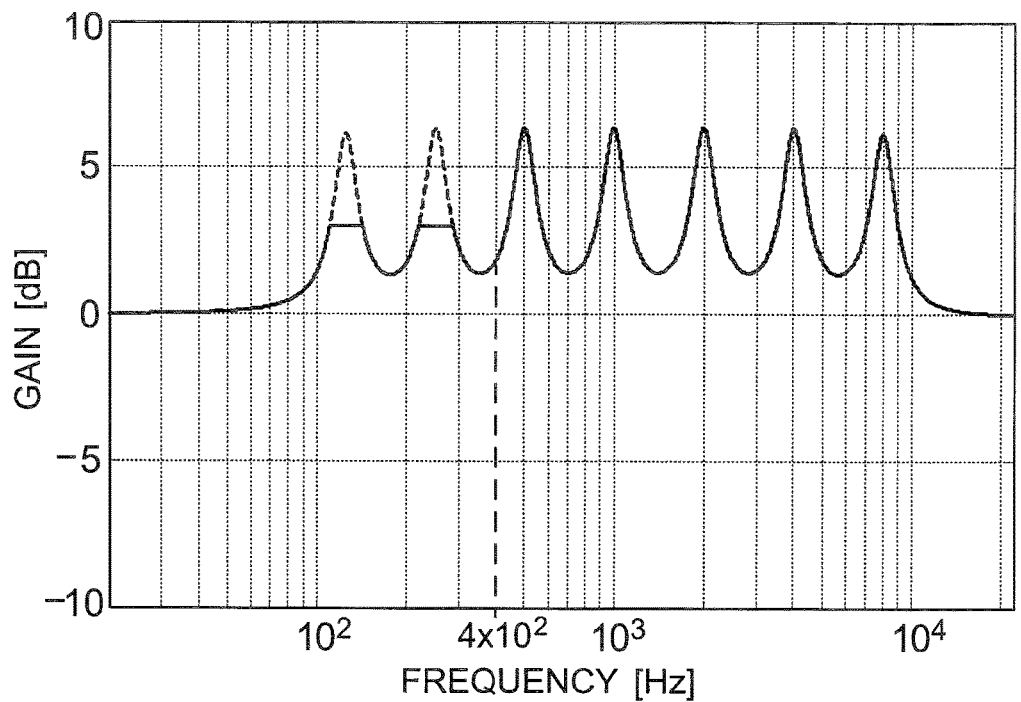
FIG. 11(a) is a diagram showing a filter coefficient when the gains at only frequencies of 400 Hz and less are limited.

FIG. 11(a) shows a filter coefficient when the gain coefficients are limited only at frequencies of 400 Hz and less and are not limited at frequencies of more than 400 Hz.

Figure 11B:
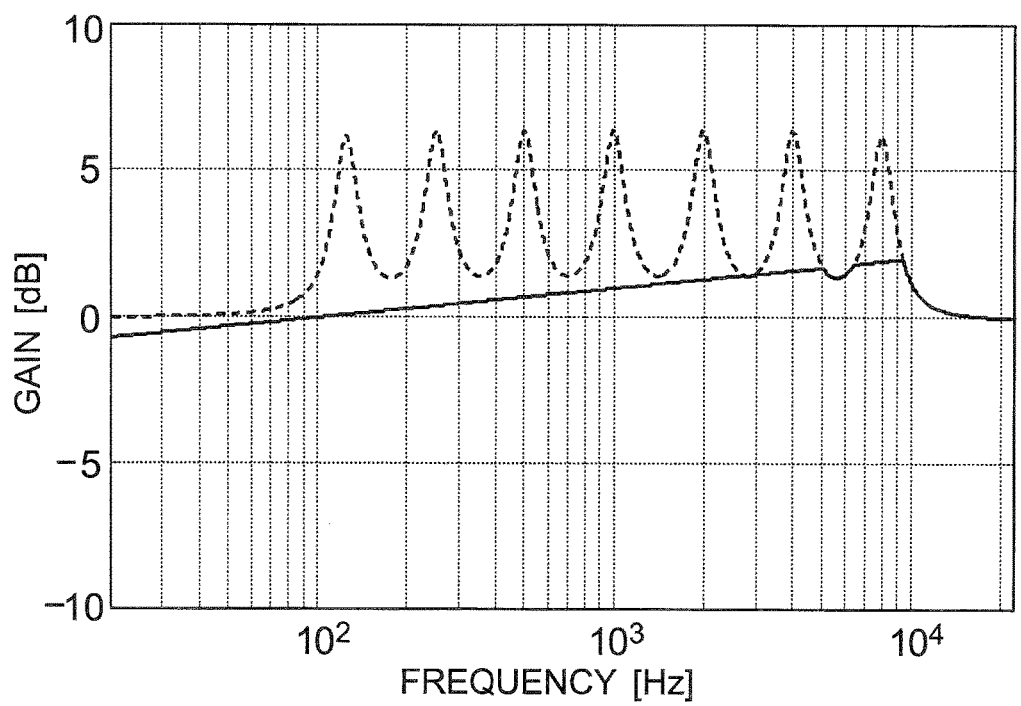
FIG. 11(b) is one diagram showing a filter coefficient when the limits of the gains are changed on the basis of weighting according to frequencies.
Figure 12A:
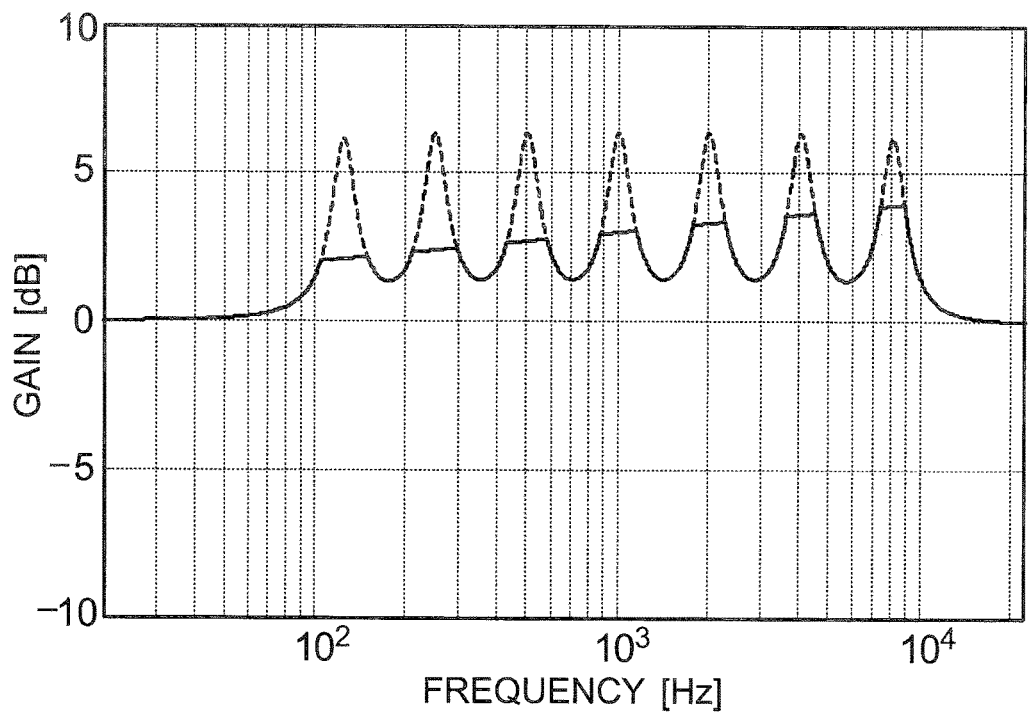
FIGS. 12(a) and 12(b) are other diagrams showing a filter coefficient when the limits of the gains are changed on the basis of weighting according to frequencies.
Figure 12B:
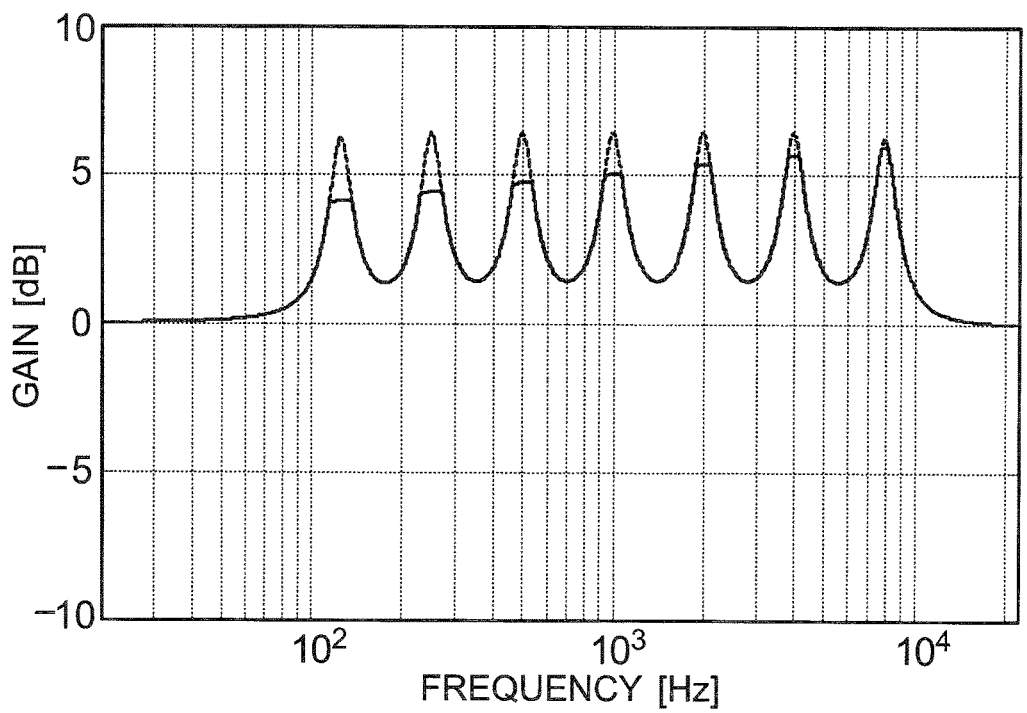

FIGS. 11(b), 12(a), and 12(b) show a filter coefficient where the gain coefficients are limited to a greater extent at lower frequencies and are allowed to increase to a greater extent at higher frequencies, that is, the gain coefficient values are weighted in accordance with the frequencies so that the limit is reduced. Regarding the limits of the gain coefficients shown in FIGS. 11(b), 12(a), and 12(b), the gain coefficients for respective bands of the filter coefficient calculated by the gain coefficient generator 31 are defined as Coef1 (dB); the gain set by the user using the volume setting unit 11 is defined as vol (dBFS); and the limited gain coefficient values are defined as Coef2 (dB). A limited gain coefficient value Coef2 (dB) at a frequency f can be calculated using Formula 2 below.

$$\text{Coef2}(f) = \min(\text{Coef}(f), |\text{vol}| + (\log_{10} f) - 2) \quad \text{Formula 2}$$

FIG. 11(b) shows a case in which the gain vol is 0 dBFS in Formula 2; FIG. 12(a) shows a case in which the gain vol is −2 dBFS in Formula 2; and FIG. 12(b) shows a case in which the gain vol is −4 dBFS in Formula 2.

Typical music (audio signal) contains great energy in low frequency ranges. For this reason, when the gains of the low frequency ranges are increased (the amplitudes are amplified), clipping is more likely to occur. If clipping occurs, harmonics occur in the audible band. Such harmonics are more likely to significantly affect the auditory sense. On the other hand, even when the gains of the high frequency ranges are increased (the amplitudes are amplified), the auditory sense is less likely to be significantly affected.

Accordingly, by limiting the gains while weighting the gain coefficients in accordance with the frequencies, as shown in FIGS. 11(a), 11(b), 12(a), and 12(b), it is possible to prevent clipping while maintaining the original amplification effect as much as possible. In the case of the filter coefficient shown in FIG. 11(a), the frequency range where the gains are limited can be narrowed. Thus, the computational load or the like associated with the limit process can be reduced.

[Gain Coefficient Storage]

The gain coefficient storage 33 serves as a memory for storing the limited filter coefficient (second filter coefficient) outputted from the gain coefficient suppressor 32. Also, if the gain coefficient storage 33 obtains a new filter coefficient (second filter coefficient) from the gain coefficient suppressor 32, it stores the latest limited filter coefficient by updating the corresponding old filter coefficient stored in the gain coefficient storage 33 to the new filter coefficient. Also, in accordance with a reading request by the frequency filter 35, the gain coefficient storage 33 can always output the stored, limited filter coefficient (second filter coefficient) to the frequency filter 35.

As described above, when the user changes a gain using the volume setting unit 11 or equalizer setting unit 12, the gain coefficient generator 31 and gain coefficient suppressor 32 calculate a new filter coefficient. For this reason, any limited filter coefficient (second filter coefficient) stored in the gain coefficient storage 33 is not updated unless the user sets or changes a gain. That is, the limited filter coefficient is not necessarily continuously updated.

On the other hand, the frequency filter 35 (to be discussed later) receives an audio signal Fourier-transformed by the FFT unit 34 continuously. For this reason, the frequency filter 35 needs to continuously perform an audio conversion process (audio processing, filtering process) using the filter coefficient. Accordingly, even if the gain coefficient generator 31 and gain coefficient suppressor 32 update the filter coefficient discontinuously, the gain coefficient storage 33 is storing the latest limited filter coefficient such that the filter coefficient can always be read and provides the limited filter coefficient to the frequency filter 35 continuously.

[Frequency Filter]

Figure 4B:
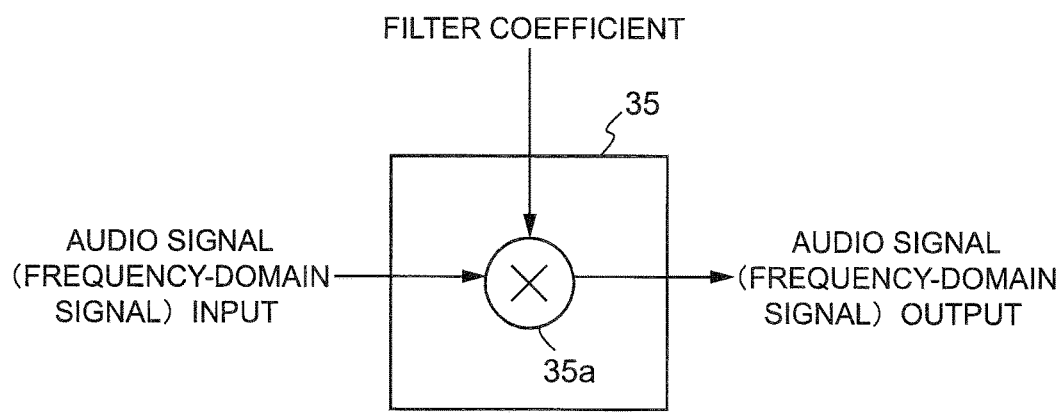
FIG. 4(b) is a block diagram showing a schematic configuration of a frequency filter according to the embodiment.

The frequency filter 35 filters the audio signal which has been transformed into a frequency-domain signal by the FFT unit 34, using the limited filter coefficient (second filter coefficient) stored in the gain coefficient storage 33. Specifically, as shown in FIG. 4(b), the frequency filter 35 includes a multiplication unit 35a. The multiplication unit 35a multiplies the received frequency-domain audio signal by the filter coefficient (a set of gain coefficients for respective frequency spectra) obtained from the gain coefficient storage 33. The audio signal is filtered in the frequency domain by this multiplication (filtering step). The frequency filter 35 then outputs the audio signal which has been multiplied by the multiplication unit 35a and thus weighted in the frequency domain, to the IFFT unit 36.

Note that the frequency filter 35 continuously filters (the multiplication unit 35a continuously multiplies) a continuously received audio signal. For this reason, the frequency filter 35 always obtains the latest limited filter coefficient from the gain coefficient storage 33, and the multiplication unit 35a performs multiplication using the latest filter coefficient.

[IFFT Unit]

The IFFT unit 36 transforms the audio signal filtered (weighted, multiplied) by the frequency filter 35 from the frequency domain into the time domain (inverse Fourier transform step). Specifically, the IFFT unit 36 transforms the audio signal from the frequency domain into the time domain by short-time inverse Fourier transforming it. The IFFT unit 36 also performs weighting using a window function and overlap addition on the audio signal. By these processes, the IFFT unit 36 generates a time-domain audio signal whose frequency characteristics have been corrected (filtered) on the basis of the volume gain (second gain) set by the user using the volume setting unit 11 and the gains for respective bands (first gains) set by the user using the equalizer setting unit 12. The IFFT unit 36 then outputs the generated audio signal to the limiter 40.

[Limit of Amplitude by Limiter]

As described above, the limiter 40 according to the present embodiment limits the amplitude of an audio signal to a range of −1 to +1. Accordingly, the amplitude of the audio signal outputted from the IFFT unit 36 is limited to a range of −1 to +1 by the limiter 40, and the resulting audio signal is outputted from a speaker (not shown) through an amplifier (not shown) as a sound audible to the user.

Figure 13A:
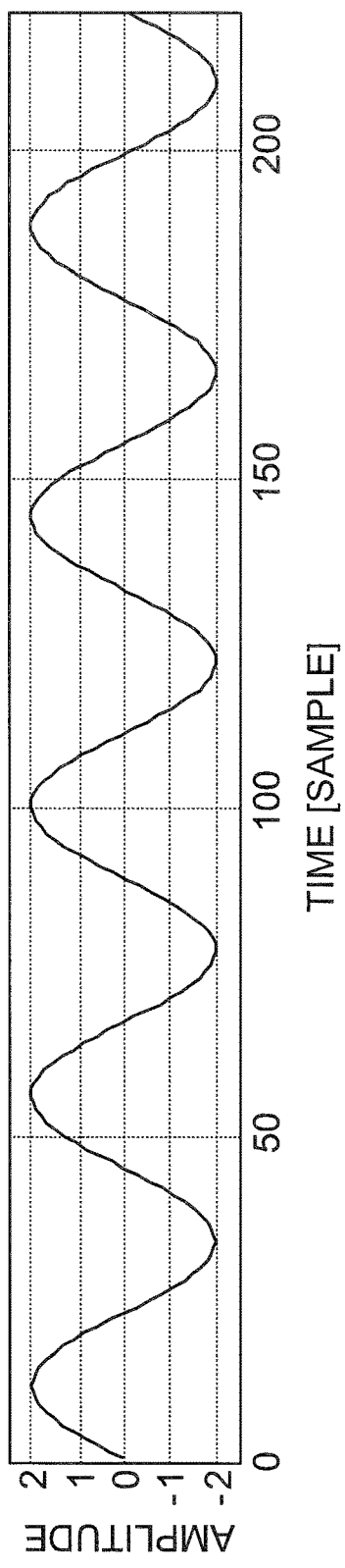
FIG. 13(a) is a diagram showing the waveform of an audio signal whose amplitude is −2 to +2.
Figure 13B:
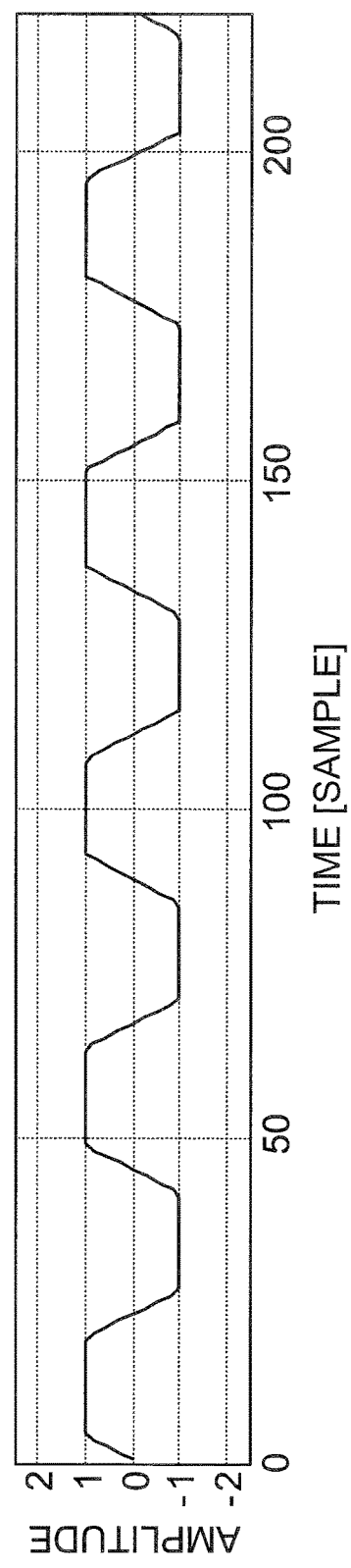
FIG. 13(b) is a diagram showing the waveform of an audio signal whose amplitude is limited to −1 to +1 by a limiter.

Note that when the amplitude of the audio signal is limited by the limiter 40, the waveform of the signal may be changed to a square shape. For example, if an audio signal consisting of a sine wave whose amplitude ranges from −2 to +2, as shown in FIG. 13(a), is inputted to the limiter 40, the amplitude is limited to −1 to +1 and thus the waveform is changed to a square waveform whose peaks are cut off, as shown in FIG. 13(b). Thus the sound is clipped and distorted.

In particular, if the user sets the gain to a relatively high volume using a volume setting unit and sets the gain in a particular band to a high value using an equalizer setting unit on a typical audio processor, the amplitude of an audio signal inputted to a limiter is more likely to exceed the amplitude range allowed by the limiter. If the amplitude of the audio signal exceeds the amplitude range allowed by the limiter, the signal waveform is deformed as shown in FIG. 13(b) and clipped, resulting in distortion of the sound.

On the other hand, when increasing or reducing the gains set by the user using the equalizer setting unit 12 for the respective bands of the audio signal that has been transformed into the frequency domain by the FFT unit 34, the audio processor 1 according to the present embodiment limits the upper limits of the gain coefficients for respective bands Coef1 (dB) of the filter coefficient generated by the gain coefficient generator 31 to the absolute value of the gain vol (dBFS) set or changed by the user using the volume setting unit 11. Thus, the amplitude (signal level) of the audio signal that has been filtered by the frequency filter 35 and transformed into the time domain by the IFFT unit 36 can be prevented from being increased and exceeding the allowable amplitude range limited by the limiter 40. Thus, the amplitude (signal level) of the audio signal filtered by the frequency filter 35 falls within the amplitude range limited by the limiter 40, allowing for prevention of clipping and the distortion of the sound.

The process of limiting the upper limits of the gain coefficients for respective bands Coef1 (dB) of the filter coefficient generated by the gain coefficient generator 31 to the absolute value of the gain set using the volume setting unit 11 is a limit process performed on the frequency-domain audio signal. Also, this process is a process of limiting only gain coefficient values exceeding the absolute value of the volume gain. For this reason, the gain coefficients are not limited in bands where the absolute value of the volume gain is not exceeded. Accordingly, the gains are limited in only some bands of the audio signal, and the sound quality of the entire audio signal is not impaired.

The audio signal that has been transformed into the time domain by the IFFT unit 36 is an audio signal where the gains have been limited in only some bands and have not been limited in most bands. For this reason, this audio signal maintains a smooth waveform and is not deformed into a square shape, although the amplitude thereof is limited to the range allowed by the limiter 40. Thus, it is possible to prevent clipping of the signal due to deformation into a square shape and thus to prevent distortion or the like of the sound while maintaining or improving sound quality.

In particular, if only the gain coefficient values in predetermined and lower bands are limited, as shown in FIG. 11(*a*) or if the gain coefficient values are limited in higher bands to a lesser extent, as shown in FIGS. 11(*b*), 12(*a*), and 12(*b*), the frequency range in which the gain coefficients are limited is narrowed. Thus, the waveform of the audio signal that has been transformed into the time domain by the IFFT unit 36 is less likely to be changed into a square shape, allowing for maintenance or improvement of the sound quality.

[Another Embodiment of Equalizer Processor]

As described above, in the equalizer processor 30 of the audio processor 1, the gain coefficient generator 31 calculates a yet-to-be-limited filter coefficient (first filter coefficient: a set of gain coefficients for respective frequency spectra Coef1), and the gain coefficient suppressor 32 calculates a limited filter coefficient (second filter coefficient: a set of gain coefficients for respective frequency spectra Coef2) and stores them in the gain coefficient storage 33, as shown in FIG. 5.

However, the data processing procedure performed by the gain coefficient generator 31, gain coefficient suppressor 32, and gain coefficient storage 33 of the equalizer processor 30, or the configurations of these components is not limited to those shown in FIG. 5.

Figure 14:
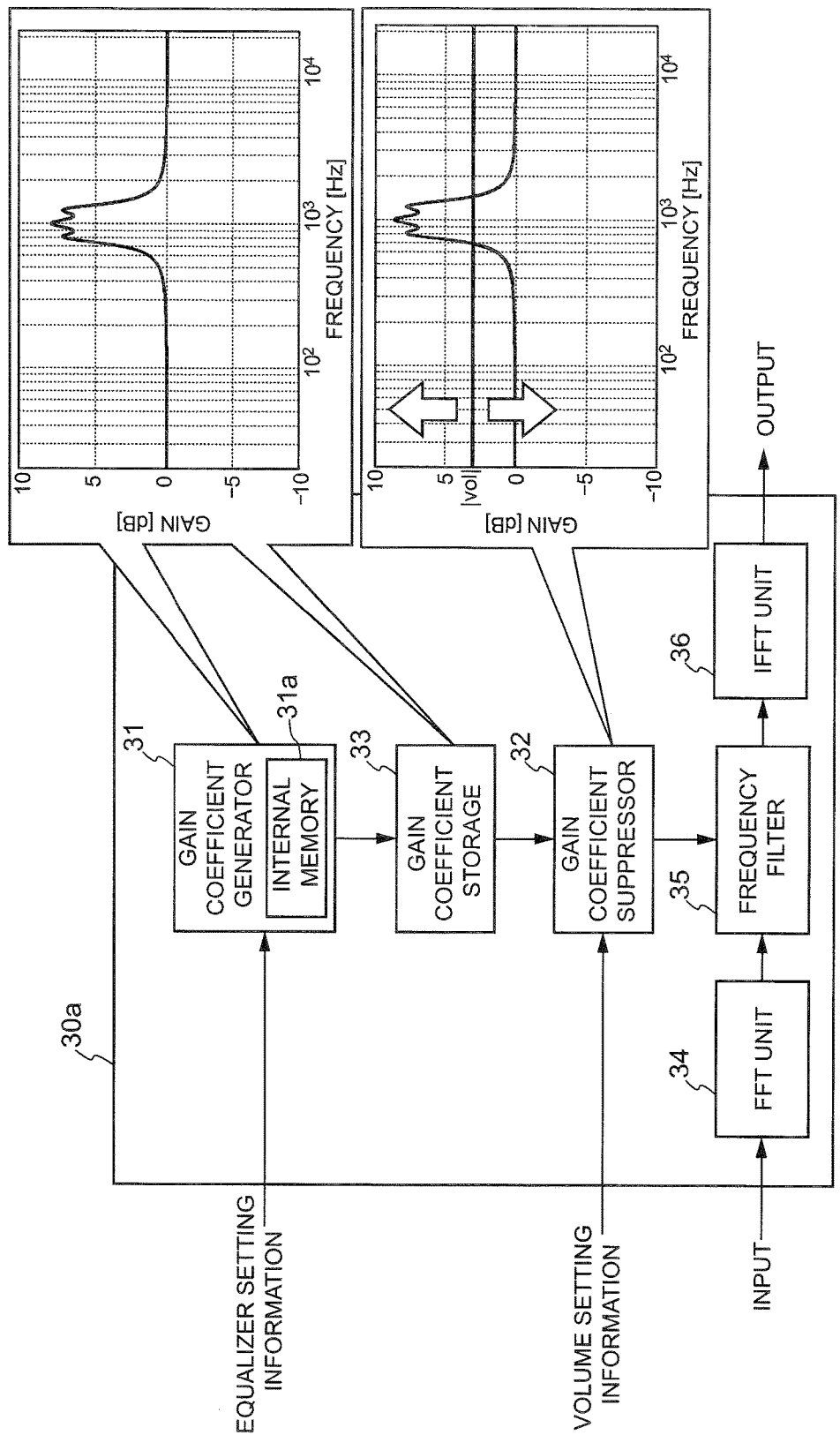
FIG. 14 is another block diagram showing a schematic configuration of an equalizer processor according to the embodiment.

FIG. 14 is a block diagram showing an equalizer processor 30*a* having a configuration different from the equalizer processor 30 shown in FIG. 5. As with the equalizer processor 30, the equalizer processor 30*a* includes a gain coefficient generator 31, a gain coefficient suppressor 32, a gain coefficient storage 33, an FFT unit 34, a frequency filter 35, and an IFFT unit 36. That is, the equalizer processor 30*a* includes function units similar to those of the equalizer processor 30 described with reference to FIG. 5. For this reason, the units from the gain coefficient generator 31 to the IFFT unit 36 will not be described in detail.

The equalizer processor 30*a* differs from the equalizer processor 30 in that the gain coefficient storage 33 is disposed between the gain coefficient generator 31 and gain coefficient suppressor 32.

More specifically, when the gain coefficient generator 31 receives equalizer setting information from the equalizer setting unit 12, it calculates a yet-to-be-limited filter coefficient (first filter coefficient: a set of gain coefficients for respective frequency spectra Coef1) and to store them in the gain coefficient storage 33. The gain coefficient generator 31 calculates a filter coefficient only if it receives equalizer setting information. Accordingly, the lastly calculated, yet-to-be-limited filter coefficient (first filter coefficient: a set of gain coefficients for respective frequency spectra Coef1) is stored in the gain coefficient storage 33 unless the gain coefficient generator 31 receives equalizer setting information.

On the other hand, the gain coefficient suppressor 32 shown in FIG. 14 always obtains volume setting information from the volume setting unit 11. The gain coefficient suppressor 32 also continuously obtains the lastly calculated, yet-to-be-limited filter coefficient (first filter coefficient) from the gain coefficient storage 33. The gain coefficient suppressor 32 also continuously (in real time) calculates Coef2 on the basis of Formula 1 or Formula 2 by limiting the values of the gain coefficients Coef1 (dB) for respective frequencies of the yet-to-be-limited filter coefficient to the absolute value of the gain vol (dBFS) in the volume setting information obtained from the volume setting unit 11. Then, as shown in FIG. 14, the gain coefficient suppressor 32 calculates a limited filter coefficient (second filter coefficient) by limiting the gain values of the filter coefficient based on the gain coefficients Coef1, on the basis of the set value of the volume setting unit 11 based on the volume setting information in real time, and outputs the limited filter coefficient to the frequency filter 35.

The frequency filter 35 always obtains the latest limited filter coefficient (second filter coefficient) from the gain coefficient suppressor 32 and filters (multiplies) a received frequency-domain audio signal.

With respect to equalizer setting information, which is generated when the user sets or changes gains, once the user sets desired gains, he or she tends to change it less frequently thereafter. With respect to volume setting information, which is generated when the user sets or changes the volume, he or she tends to change it more frequently than equalizer setting information.

For this reason, only when it receives equalizer setting information, which is changed less frequently, the equalizer processor 30*a* shown in FIG. 14 calculates a yet-to-be-limited filter coefficient (first filter coefficient) and stores the yet-to-be-limited filter coefficient in the gain coefficient storage 33. Due to this process, the frequency with which the gain coefficient generator 31 calculates a filter coefficient can be reduced. Thus, the processing load on the equalizer processor 30*a* can be reduced compared to that on the equalizer processor 30 shown in FIG. 5.

On the other hand, with respect to a change in the gain about the volume, which is updated more frequently, the gain coefficient suppressor 32 continuously obtains volume setting information, calculates a limited filter coefficient (second filter coefficient) by limiting the gain values of the yet-to-be-limited filter coefficient (first filter coefficient) based on the gain coefficients Coef1 in real time, and outputs the limited filter coefficient to the frequency filter 35. Due to this process, the gain values of the yet-to-be-limited filter coefficient can be limited linearly so as to follow the operation of the operation control 11a. Thus, the ability to follow the volume operation by the user can be increased, and a limited filter coefficient can be calculated quickly in response to the volume operation by the user and thus the frequency filter 35 can perform filtering.

As described above, when the user sets or changes the gains for respective bands using the equalizer setting unit 12, the audio processor 1 according to the present embodiment limits the gain coefficients for respective bands Coef1 (dB) of the filter coefficient calculated by the gain coefficient generator 31 to the absolute value of the gain (dBFS) set using the volume setting unit 11. Thus, even if the audio signal filtered by the frequency filter 35 on the basis of the settings of the equalizer setting unit 12 is transformed into a time-domain signal, the amplitude of the time-domain audio signal can be prevented from exceeding the amplitude range allowed by the limiter 40. Thus, it is possible to prevent the amplitudes of the peaks of the audio signal filtered by the frequency filter 35 from being limited by the limiter 40 and to prevent distortion of the sound due to clipping.

If the user sets or changes the gains in adjacent bands using the equalizer setting unit 12, the peaking filters of the adjacent bands may influence each other, and the peaks (gains) of the entire filter coefficient may become higher (greater) values than the gains for the respective bands set by the user using the equalizer setting unit 12. Even in this case, the audio processor 1 according to the present embodiment limits the gain coefficients for respective bands Coef1 (dB) by saturation operation so as not to exceed the absolute value of the gain (dBFS) set using the volume setting unit 11. Thus, the gain coefficients for respective bands can be effectively limited, regardless of increases in the gain coefficients due to the peaking filters of the adjacent bands (without being affected by the increased gain coefficient values, or the like).

The audio processor 1 according to the present embodiment calculates a yet-to-be-limited filter coefficient on the basis of the gain coefficients for respective bands set by the user using the equalizer setting unit 12. The audio processor 1 then performs saturation operation on the yet-to-be-limited filter coefficient on the basis of the absolute value of the gain (dBFS) set using the volume setting unit 11. Then, the frequency filter 35 of the audio processor 1 filters the frequency-domain audio signal by multiplying the audio signal by the filter coefficient (limited filter coefficient) that has been subjected to the saturation operation. Due to these processes, the audio signal that has been transformed into a time-domain audio signal by the IFFT unit 36 can maintain a smooth waveform. Also, the audio processor 1 can process the audio signal so that the amplitude thereof falls within the predetermined amplitude range limited by the limiter 40. Thus, it is possible to prevent the waveform of the audio signal from being changed to a square shape by the limiter 40 and to output a sound that does not give auditory discomfort.

While the audio processor and audio processing method according to one embodiment of the present invention have been described in detail using the audio processor 1 as an example, the audio processor and audio processing method according to the present invention are not limited to the example described in the embodiment. Those skilled in the art would apparently conceive of various changes or modifications thereto without departing from the scope of claims, and such changes or modifications can also produce effects similar to those of the example described in the embodiment.

REFERENCE SIGNS LIST

1 audio processor
10 operation unit
11 volume setting unit
11a operation control (of volume setting unit)
11b volume curve calculator (of volume setting unit)
12 equalizer setting unit (band gain setting unit)
20 volume processor
21 gain unit (of volume processor)
30, 30a equalizer processor
31 gain coefficient generator (first filter coefficient calculator)
31a internal memory (of gain coefficient generator)
32 gain coefficient suppressor (second filter coefficient calculator)
33 gain coefficient storage
34 FFT unit (Fourier transform unit)
35 frequency filter (filtering unit)
35a multiplication unit (of frequency filter)
36 IFFT unit (inverse Fourier transform unit)
40 limiter

The invention claimed is:
1. An audio device comprising:
an audio processor configured to:
  transform an audio signal from a time-domain signal into a frequency-domain signal;
  perform a filtering process on the audio signal that has been transformed into the frequency-domain signal, using a second filter coefficient;
  transform the audio signal subjected to the filtering process, from the frequency-domain signal into a time-domain signal;
  set first gains for respective bands used to perform the filtering process on the audio signal;
  set a second gain for increasing or reducing a volume of the audio signal;
  calculate a first filter coefficient that can increase or reduce gains for respective bands, so as to correspond to the first gains for the respective bands; and
  regard gains for respective bands of the first filter coefficient as third gains, to compare values of the third gains for the respective bands with an absolute value of the second gain, and to, if the values of the third gains for the respective bands are greater than the absolute value of the second gain, calculate the second filter coefficient by limiting the values of the third gains for the respective bands to the absolute value of the second gain.

2. The audio device according to claim 1, wherein when limiting the values of the third gains for the respective bands to the absolute value of the second gain, the audio processor limits only the values of the third gains for predetermined frequency bands.

3. The audio device according to claim 1, wherein
when limiting the values of the third gains for the respective bands to the absolute value of the
second gain, the audio processor changes the values of the third gains by weighting values of the third gains, in accordance with frequencies.

4. An audio processing method using an audio processor comprising:
- a Fourier transform step of transforming, by a Fourier transform unit, an audio signal from a time-domain signal into a frequency-domain signal;
- a filtering step of performing, by a filtering unit, a filtering process on the audio signal that has been transformed into the frequency-domain signal, using a second filter coefficient;
- an inverse Fourier transform step of transforming, by an inverse Fourier transform unit, the audio signal subjected to the filtering process in the filtering step from the frequency-domain signal into a time-domain signal;
- a first filter coefficient calculation step of calculating, by a first filter coefficient calculator, a first filter coefficient that can increase or reduce gains for respective bands, so as to correspond to first gains for respective bands set by a user; and
- a second filter coefficient calculation step of regarding, by a second filter coefficient calculator, gains for respective bands of the first filter coefficient as third gains, comparing values of the third gains for the respective bands with an absolute value of a second gain set by the user to increase or reduce a volume of the audio signal, and if the values of the third gains for the respective bands are greater than the absolute value of the second gain, calculating the second filter coefficient by limiting the values of the third gains for the respective bands to the absolute value of the second gain.

5. The audio processing method according to claim 4, wherein the second filter coefficient calculation step comprises when limiting the values of the third gains for the respective bands to the absolute value of the second gain, limiting only the values of the third gains for predetermined frequency bands.

6. The audio processing method according to claim 4, wherein the second filter coefficient calculation step comprises when limiting the values of the third gains for the respective bands to the absolute value of the second gain, changing the values of the third gains by weighting values of the third gains, in accordance with frequencies.

* * * * *